United States Patent [19]

Chua et al.

[11] Patent Number: 4,819,200

[45] Date of Patent: Apr. 4, 1989

[54] REAL-TIME N-DIMENSIONAL ANALOG SIGNAL ROTATOR

[75] Inventors: Leon O. Chua, El Cerrito, Calif.; Isutomu Sugawara, Yokosuka, Japan

[73] Assignee: The Regents of the University of California, Berkeley, Calif.

[21] Appl. No.: 845,855

[22] Filed: Mar. 28, 1986

[51] Int. Cl.$^4$ .......................... G06G 7/16; G06G 7/00
[52] U.S. Cl. ..................................... 364/841; 364/807
[58] Field of Search ..................... 364/827, 841–849, 364/606, 807, 861

[56] References Cited

U.S. PATENT DOCUMENTS 4,084,136 4/1978 Libby et al. .......................... 324/238

Primary Examiner—Jerry Smith
Assistant Examiner—Charles B. Meyer
Attorney, Agent, or Firm—Owen, Wickersham & Erickson

[57] ABSTRACT

Apparatus and method for use with a cathode ray oscilloscope for displaying from any desired perspective a multi-dimensional surface evolving in time multi electrical signal are introduced to attachment to related electrical signal-carrying means, a multiplicity of two-dimensional rotators. For the number N of signals and therefore of N dimensions there are $$N!/2 \, (N-2)!$$

two dimensional rotators. Each rotator is connected to a different pair of these signals and provide two-dimensional rotation of the paired signals. The rotators are connected together to produce signal outputs corresponding to the number of signals introduced, each signal passing through two rotators as each signal makes its way to its respective signal output. The outputs are connected to a cathode ray oscilloscope, at least two at a time.

20 Claims, 33 Drawing Sheets (a)

(b)

(a)

(b)

(a)

(b)

(a)

(c)

(b)

(d)

(a)

(b)

(c)

(d)

(a)

(b)

(d)

(c)

(a)

(d)

(b)

(e)

(c)

(f)

(b)

(c)

(a)

(b)

(a)

(b)

(c)

(a)

(b)

(c)

(d)

(a)

(b)

(a)

(c)

(b)

(d)

(a)

(c)

(b)

(a)

(b)

(a)

(b)

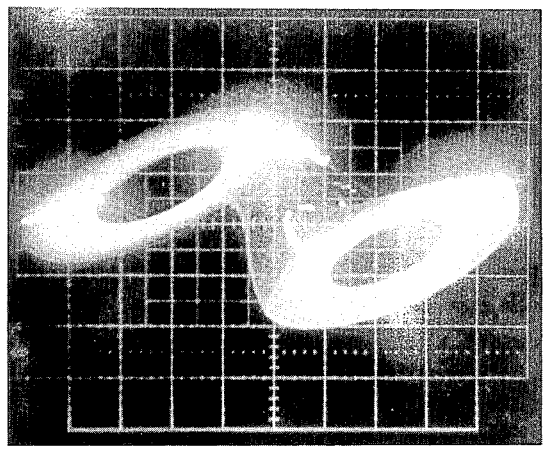
(a)
FIG. 36
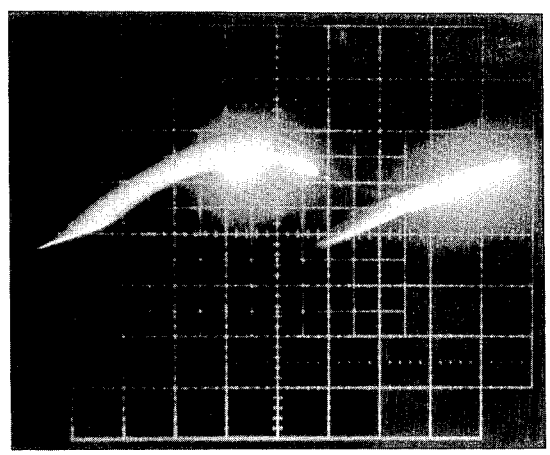
(b)
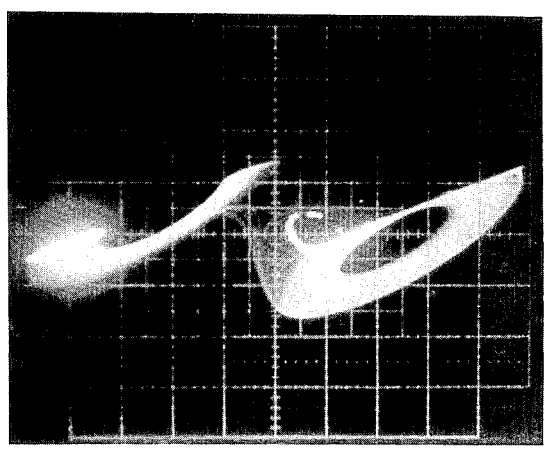
(c)

REAL-TIME N-DIMENSIONAL ANALOG SIGNAL ROTATOR

This invention relates to both method and apparatus. The apparatus can be an electronic instrument which, when used with a standard oscilloscope, enables display of a two-dimensional projection from any desired perspective of an n-dimensional surface S evolving in time, where n is three or greater. A three-dimensional surface S, for example, represents the dynamic loci of three electrical signals x(t), y(t) and z(t) in the X-Y-Z space over some observation time interval.

This invention was made with Government support under Grant No. ECS-8313278 awarded by the National Science Foundation and also under Contract No. N00014-76-C-0572 between the Office of Naval Research, Department of the Navy, and the University of California. The Government has certain rights in this invention.

The rotation in this invention is applicable for N distinct electrical signals, and the signal can be rotated in real time via electronic circuits, rather than being merely rotated by digital computations.

The invention applies to any electronic circuit which implements an "orthogonal matrix transformation" in any dimension. We do not claim implementation of non-electrical signal rotations by non-electrical means, e.g., mechanical rotation using gears and cam.

The invention is a practical, and presently the only, method for observing the cross-section of any strange attractor (or any n-dimensional Lissajous figure generated by N electrical signals) from any perspective, and in forward or reverse time.

Many engineering designs require a detailed *instantaneous* inspection of various *perspectives* and *cross-sections* of a three-dimensional surface evolving with time. Such a surface can be described as the collection of points (x,y,z) in X-Y-Z space generated by three electrical signals x(t), y(t) and z(t). These signals may arise from electrical systems, or they may be obtained from sensors monitoring such complicated dynamical phenomena as turbulence encountered in airplane flights and stress patterns in structures. This invention allows such a surface to be analyzed in *real time* (instead of by computer software which is often too slow and is too bulky to be used as a portable instrument) by projecting it onto an oscilloscope screen. With this invention, the surface can be rotated to *any desired* orientation, and the rotation continued during observation. Moreover, *any cross-section* of the surface can be dissected and displayed instantaneously on an oscilloscope.

Other application of this invention include:
1. An effective and practical method for analyzing various cross-sections of strange attractors widely observed in nonlinear dynamical systems, in real time.
2. An inexpensive accessory to be attached to conventional oscilloscopes for displaying two-dimensional projections from any perspective.
3. Measurement of three-dimensional fields, such as electric or magnetic fields, from any direction, even though the sensors are fixed in space, as in a space vehicle or satellite.
4. Implementation of any signal transformation which calls for an orthogonal transformation in higher dimensional space in real time.
5. Rotation of any n-dimensional signal in real time.
6. In many applications involving sensors in moving objects, such as rockets and satellites, for measuring three-dimensional fields, it is necessary to rotate the sensors with respect to the field. This requirement can be implemented by rotating the sensor signals in the reverse direction using this invention.

For low-speed applications, or in applications where real-time rotation is not essential, this rotator can be implemented by converting the analog signals first into a digital signal via an A/D converter, implementing the orthogonal transformation digitally, and finally reconverting the output digital signal into an analog signal via a D/A converter. The orthogonal transformation in this case may be implemented by a dedicated microprocessor, or a special purpose digital signal processor.

INTRODUCTION

At any instant of time $t_o$, $(x(t_o), y(t_o), z(t_o))$ can be thought of as the *position* of a particle, or a planet, in three-dimensional space. As time evolves, this particle, or planet, traces out a continuous trajectory. If the motion represented by $(x(t), y(t), z(t))$ is periodic, as is the case of a planet, this trajectory will eventually repeat itself. However, if the motion is *not* periodic, as is the case in many practical applications, this trajectory never repeats itself and over a long period of time, fills some volume in space whose overall envelope is a three-dimensional surface S. This surface is usually extremely complicated, with cross-sections which are fractals, and to analyze its geometric structure would require a detailed analysis of different perspectives and cross-sections of S on the oscilloscope screen. It is necessary in such analyses to take perspectives and cross-sections because the oscilloscope can display only two dimensional objects.

If two of the three signals are connected to the horizontal and vertical channels of the oscilloscope, no more than three possible projections into the X-Y, Y-Z, or Z-X plane, respectively, can be obtained. What is needed in practice, however, is to be able to view the projection from any direction. This is analogous to applying a beam of light in any desired direction onto the surface S and then observing its shadow on a white screen behind S. Mathematically, this operation is equivalent to rotating each of the three coordinate axes through any desired angle from 0 to 360 degrees and then taking its projection.

Another important operation needed in studying the structure of S is to pass a plane surface D through S at *any desired position* in space and look at the *intersection points* between S and $S_o$. This set of intersection points is called a *cross-section* of S with respect to D. In the case of strange attractors, such as the double scroll, such cross-sections are fractals.

One possible approach for implementing the above task is to sample the signals with a high-speed analog-to-digital (A/D) converter and then process the data mathematically by a digital computer before outputting the transformed data into a digital-to-analog (D/A) converter for final display on the oscilloscope. However, one major problem with this approach is that accurate and high-speed data acquisition and processing, currently require very expensive hardwares in addition to a dedicated digital computer. Even then, the displayed signal is no longer in real time. Another limitation of the digital approach is that some of the detailed nature of the signals may be lost in the course of data acquisition, unless the signals are properly scaled and the resolution of the analog-to-digital converter is sufficiently high. An even more serious limitation of the digital approach becomes obvious in the case of complex (non-periodic) dynamics where the sequence of data to be taken is extremely large and may easily exceed the available computer memory.

The present invention involves a novel electronic circuit for implementing the above-described mathematical operations instantaneously.

One immediate use of this invention is to analyze a complicated surface called a *strange attractor*, which is associated with many nonlinear dynamical phenomena called *chaos*. This is a very active area of research in physics, chemistry, fluid dynamics, economics, biology, and engineering. The complicated experimental data can be transformed by appropriate transducers into electrical signals, and the present invention makes it possible to translate these data into a continuous spectrum of perspectives and cross-sections *in real time*. Such cross-sections are known in this discipline as *Poincaré maps*.

There are many other applications where the apparatus and method of this invention will be extremely useful if not indispensable. Indeed, any nonlinear phenomena (e.g., fluid mechanics, wind tunnel testing, turbulence), where three dominant dynamic variables can be identified and measured, will find the apparatus of this invention to be an ideal tool.

The apparatus may be a plug-in unit added to an existing oscilloscope. The apparatus of the invention is completely automatic, in the sense that the user can either request a specific perspective or cross-section, or he can request that the perspectives be obtained over all possible orientations automatically.

THE STATE OF THE ART PRIOR TO THIS INVENTION

No apparatus of the type described above existed before the present invention. The closest analogy to the apparatus would be the writing of a computer program to calculate the necessary mathematical operations. However, a computer with high-resolution graphics would be required and would therefore be much more expensive. Moreover, such a computer would not be portable, and the result could not even be obtained instantaneously, as is the case in this invention, which is a real-time solid-state circuit. Moreover, the apparatus can be integrated into IC chips, and would then be extremely small in size.

SUMMARY OF THE INVENTION

In this invention three or more electrical signals that have some relation to each other, are fed to a three-dimensional or n-dimensional rotator. Such a three-dimensional rotator may comprise a series of three two-dimensional rotators linked together. The outputs from the three-dimensional rotator are then ready for application to a cathode ray oscilloscope. For n-dimensions, where $n>3$, there will be many more two-dimensional rotators, as given by the formula number of two-dimensional rotators $= N!/2(N-2)!$.

The invention can provide either a stationary image, which can be manually changed to achieve stepped rotation, or there can be automatic rotation. There can also be a reference plane generator to provide a reference plane that can be used as valuable study aid. Also, plane cutting means are provided, which can be used to cut the rotating figure or stationary figure in two at any point along the plane to enable further study of such a figure. If the reference plane or cutting plane forms part of the display, it is a good idea to provide a multiplexor for alternating the signals in such a way that the eye reacts to them as if they were being simultaneously generated.

In order to provide uniformity of input signals, preamplifiers may be used prior to sending the signals to the three-dimensional rotator. Also, amplification may be used in any degree where desired.

In the method of the invention, three or more signals are linked together in such a way that any two of them can be fed to a cathode ray oscilloscope, and rotation of the configuration is provided to give images on the oscilloscope that correspond to either stationary or automatically rotating images.

BRIEF DESCRIPTION OF THE DRAWINGS

FIG. 13 is a set of four diagrams for the geometrical interpretation of a three-dimensional rotation operation, showing at:

(a) an input coordinate view of a rectangular "brick", (b) an output coordinate view after applying a rotation operation $R_x(\theta_x)$ to (a), (c) an output coordinate view after applying a rotation operation $R_y(\theta_y)$ to (b), and (d) an output coordinate view after applying a rotation operation $R_z(\theta_z)$ to (c).

Figure 14:
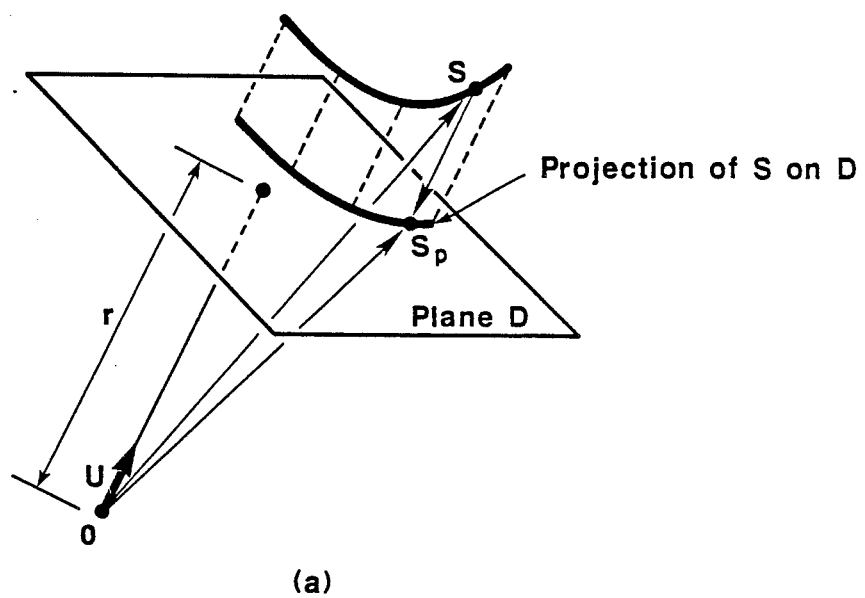
Figure 14:
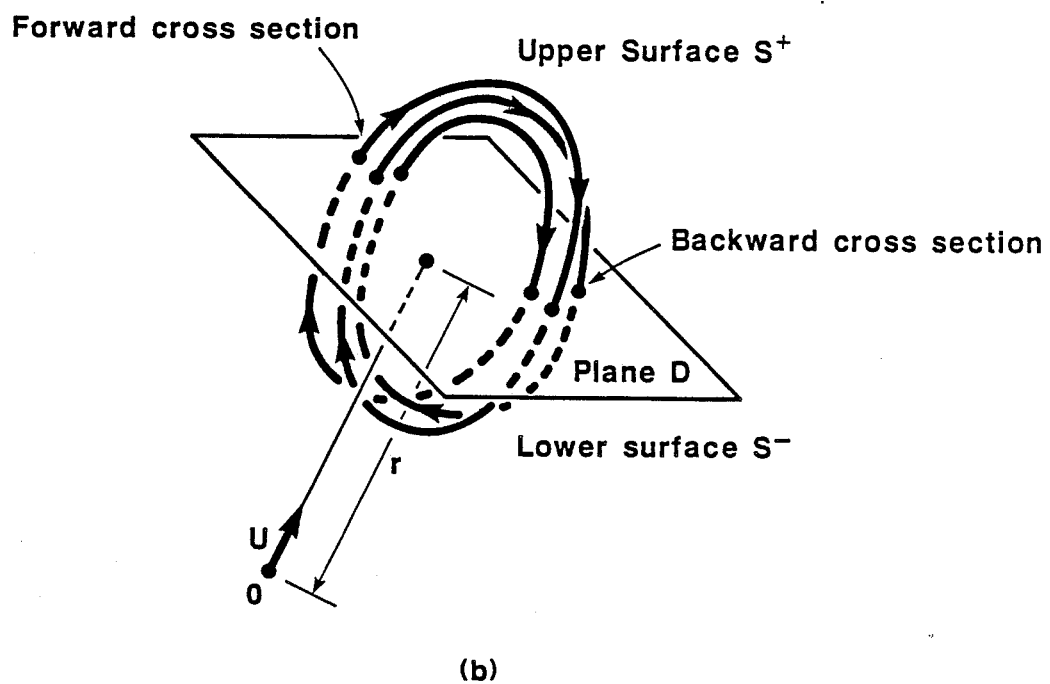

FIG. 14 is a geometrical interpretation of the perpendicular projection and cross-sectioning operation. A plane D is defined by a normal direction vector U, and the distance of the plane D from the origin is denoted by r, FIG. 14 shows:
(a) a perpendicular projection of the surface S onto a plane D, and
(b) the upper and the lower cross-section of the surface S (six solid dots in this example) relative to the plane D.

Figure 15:
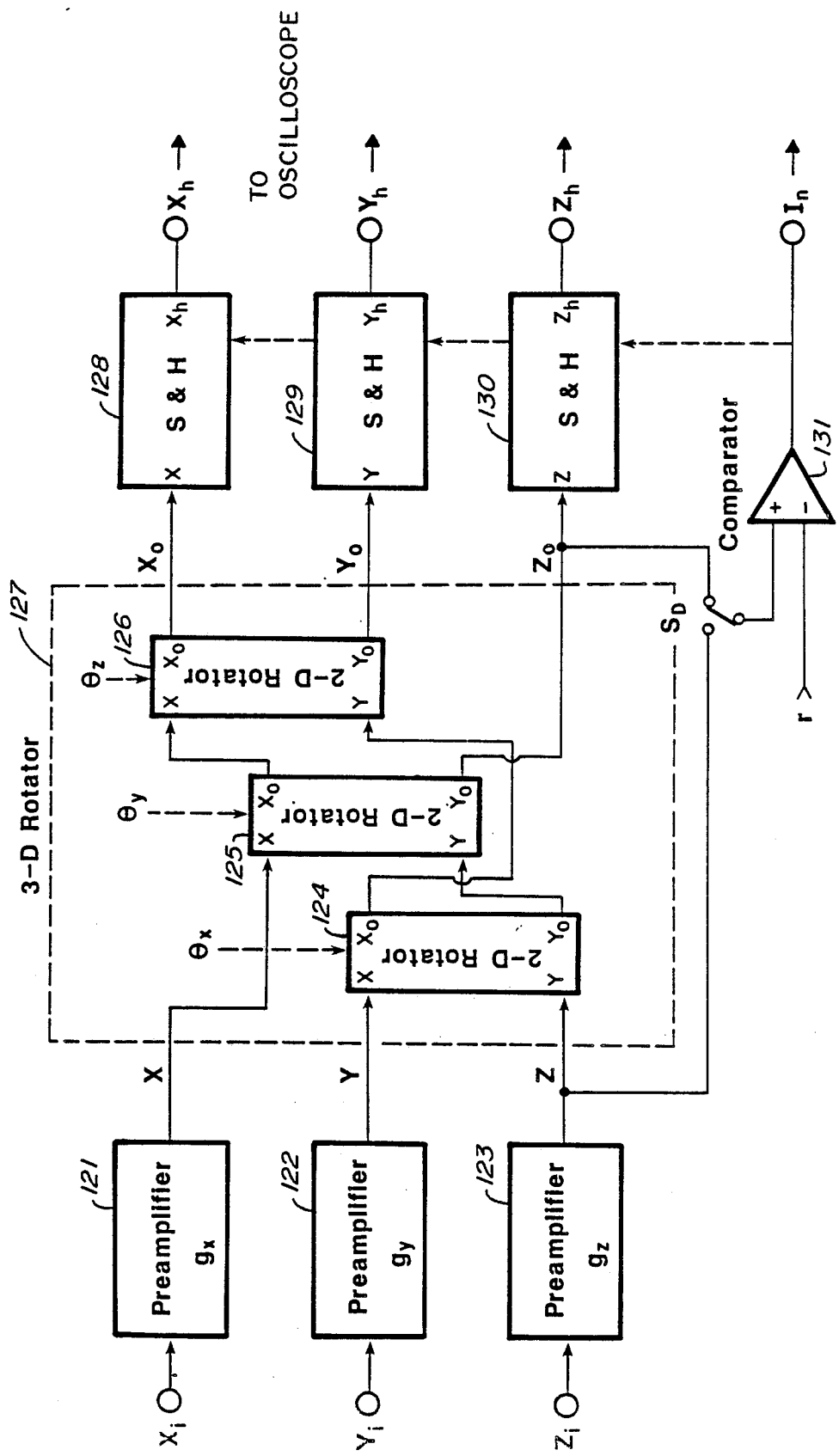

FIG. 15 is a simplified block diagram of a 3-D rotation instrument embodying the principles of this invention. This view may be considered a simplified version of FIG. 5, for it lacks continuous rotation.

Figure 16:
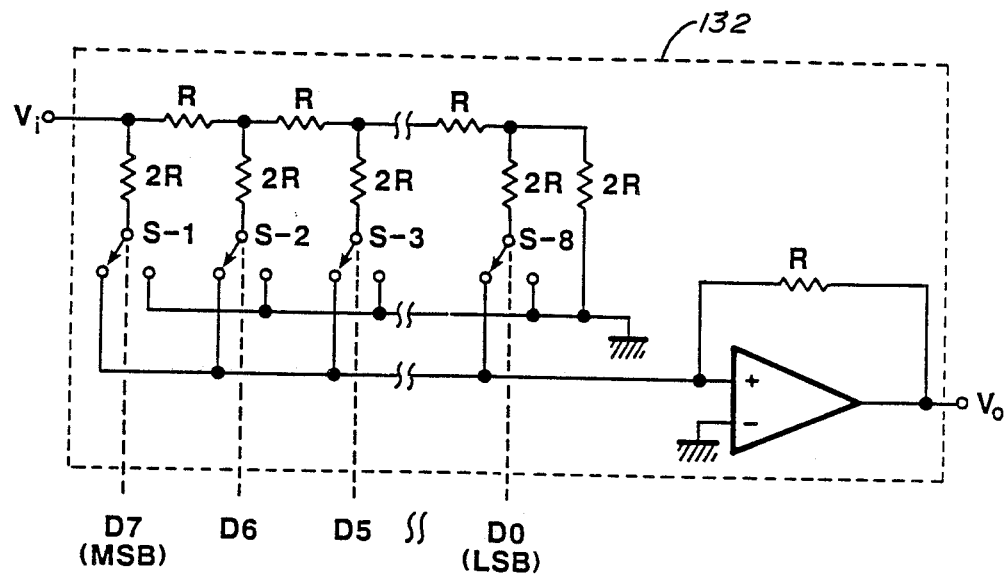

FIG. 16 is a diagram of a scalar multiplier circuit for use in this invention, the gain of this circuit is determined by a set of digitally-controlled switches S-1 to S-8 (the switches S-4 to S-7 and related components being omitted).

Figure 17:
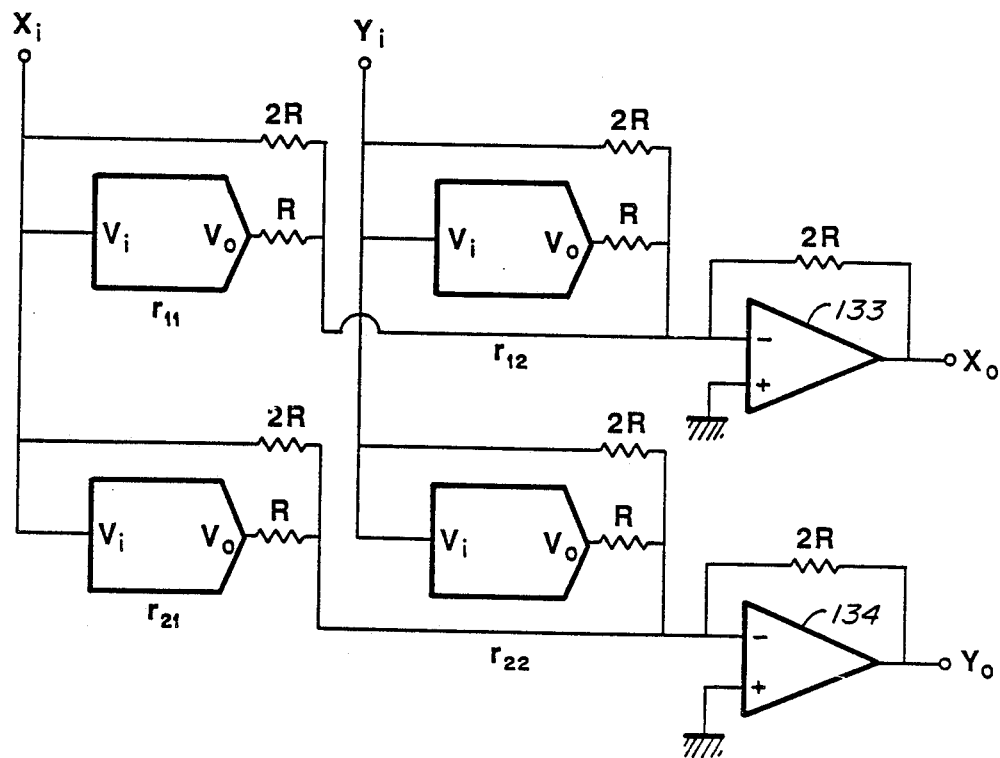

FIG. 17 is a diagram of a simplified two-dimensional matrix multiplier circuit, the modules m1, m2, m3 and m4 denoting scalar multipliers like that of FIG. 16.

Figure 18:
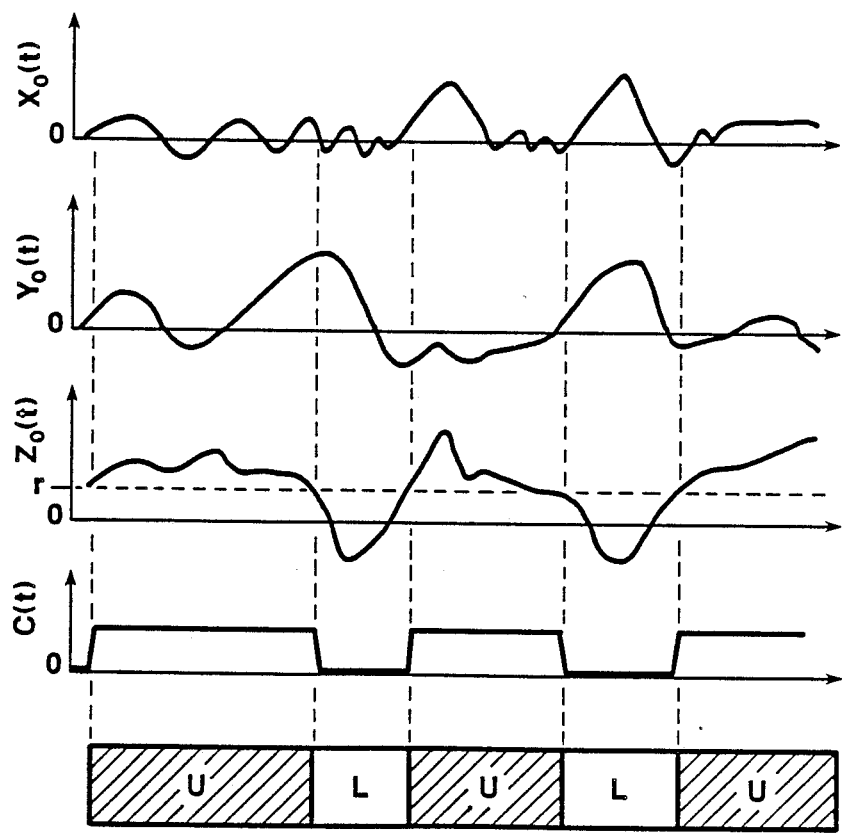

FIG. 18 is a diagram of sample signals illustrating the display of the projection of the upper and lower surfaces of S. $X_0(t)$, $Y_0(t)$, and $Z_0(t)$ are sample waveforms, C(t) a comparator output signal obtained by comparing $Z_0(t)$ with a dc signal of magnitude r, and U and L denote the time intervals corresponding to the upper and lower surfaces, respectively.

Figure 19:
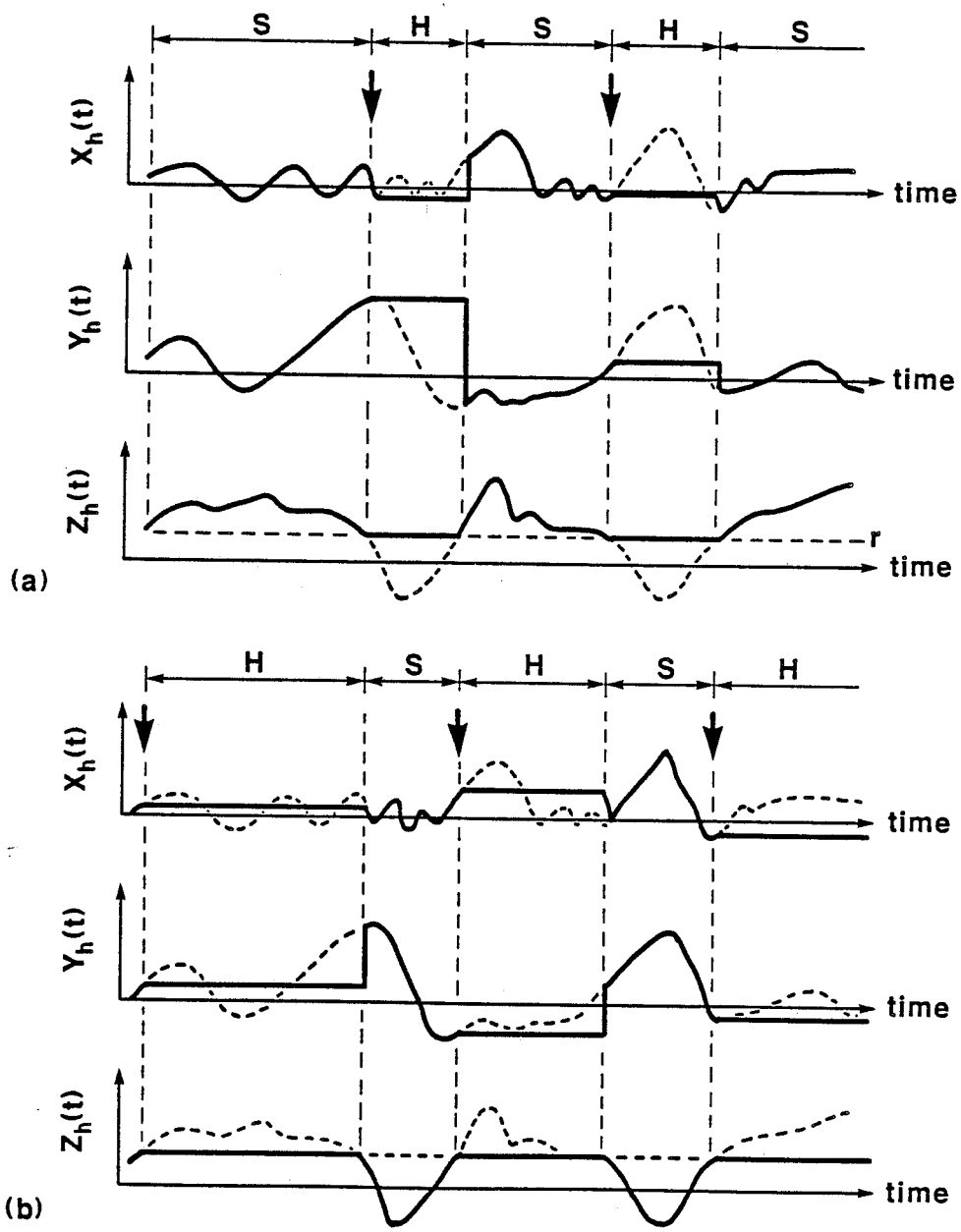

FIG. 19 comprises a pair of views showing sample signals and illustrating the display of the cross-section of S in both backward and forward directions, the solid curves denoting the output waveforms of the sample-and-hold circuits. FIG. 19 shows at
(a) an output waveform for displaying the backward cross-section, and
(b) an output waveform for displaying the forward cross-section.

The broken lines indicate the original input signals, which were clamped to a constant level during its entire hold "H" time interval.

Figure 20:
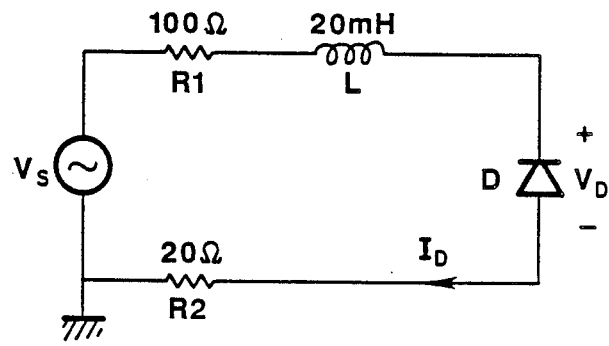
Figure 20:
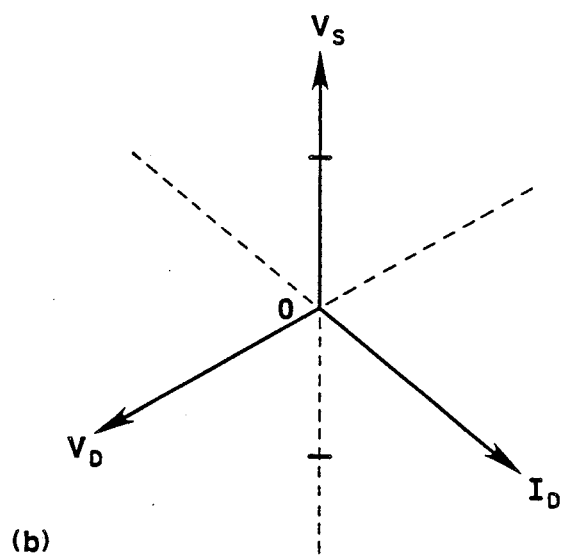

FIG. 20 comprises a pair of views for a driven series R-L-diode circuit, showing at
(a) the circuitry, and
(b) the coordinates system for Poincaré mapping, including the excitation signal $V_s$.

Figure 21:
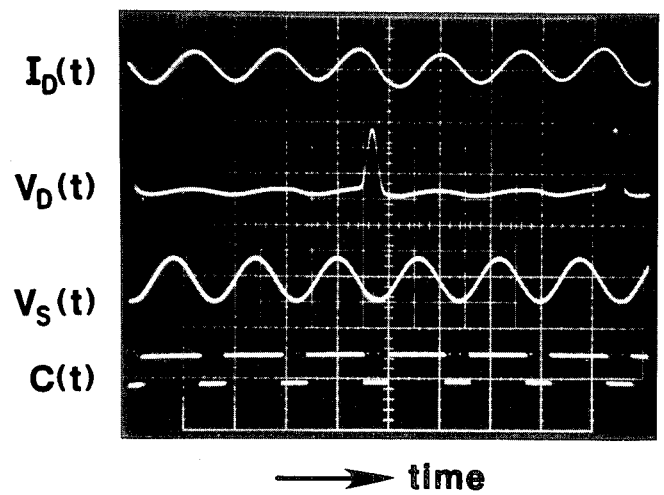
Figure 21:
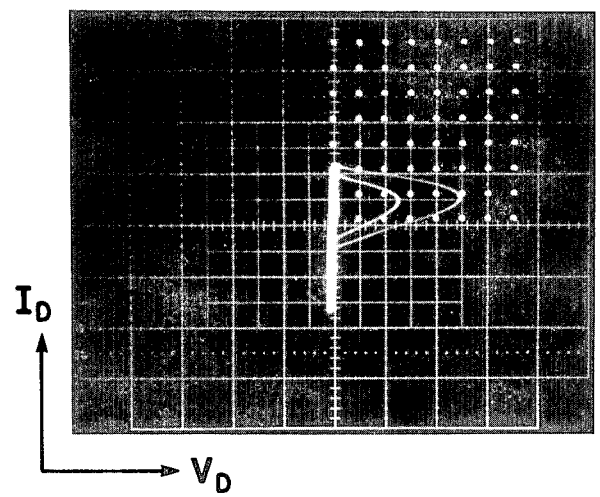

FIG. 21 comprises a pair of reproductions of a CRT display of waveforms and their unrotated projections associated with the R-L diode circuit, prescaling $X=V_D$, $Y=3,000\Omega I_D$, and $Z=V_S$, and showing at
(a) waveforms associated with a period-three limit cycle, at a horizontal scale of 20 μsec. and a vertical scale in 5-volt divisions, and
(b) a projection on the $V_D$-$I_D$ plane, the reference plane indicating a one-volt per division scale.

Figure 22:
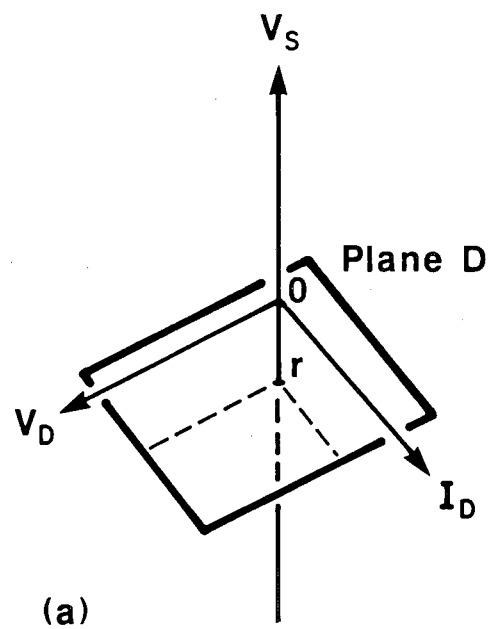
Figure 22:
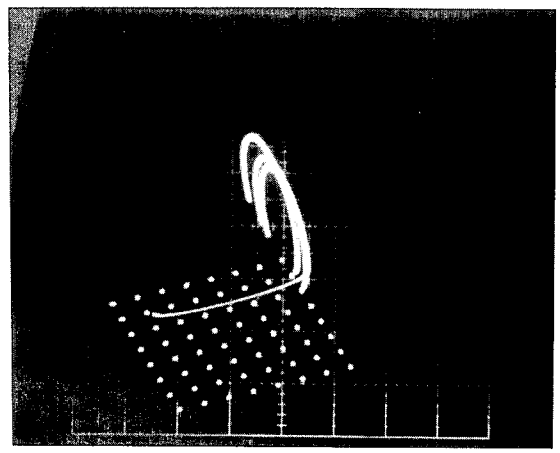
Figure 22:
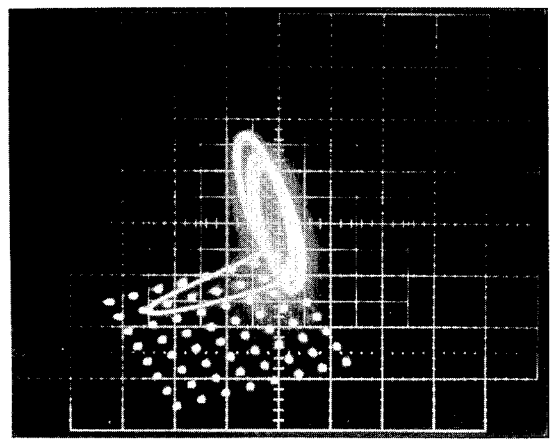
Figure 22:
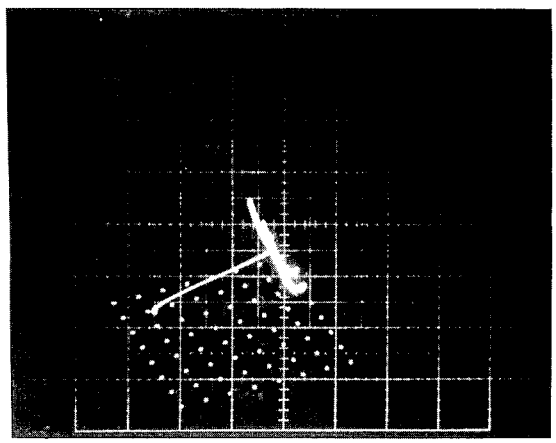

FIG. 22 comprises a set of four related views, three of which are projections of a rotated period-three limit cycle, with prescaling the same as for FIG. 21. The views are
(a) the location of a cutting plane D, a $V_D$-$I_D$ plane passing through $V_s=r$ (negative value),
(b) a projection of the whole surface onto the $X_o$-$Y_o$ plane,
(c) a projection of only the upper surface onto the $X_o$-$Y_o$ plane, and
(d) a projection of only the lower surface onto the $X_o$-$Y_o$ plane.

Figure 23:
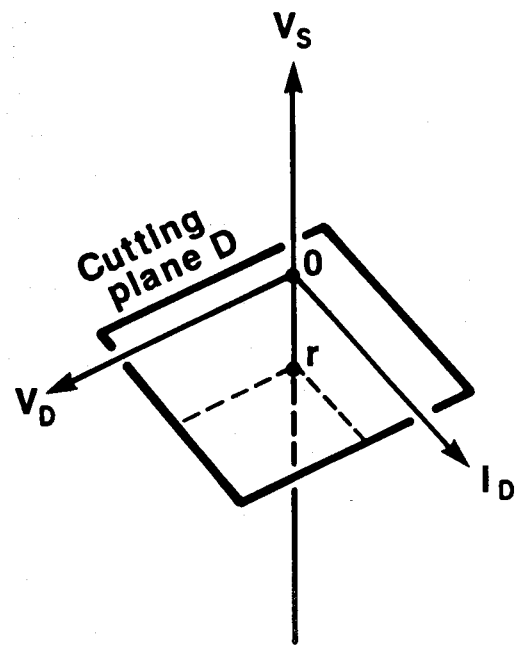
Figure 23:
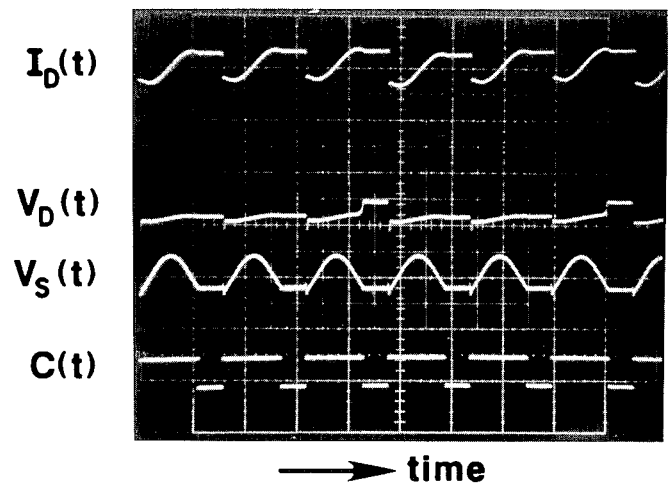
Figure 23:
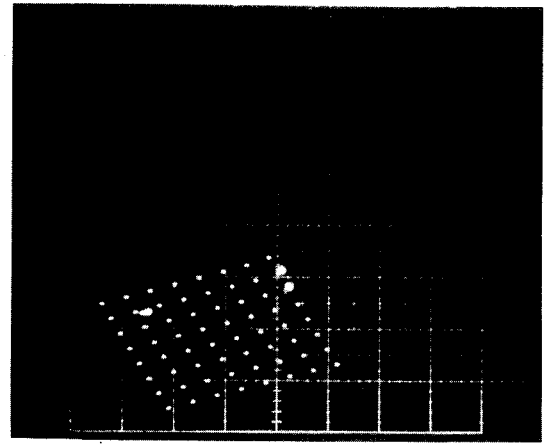
Figure 23:
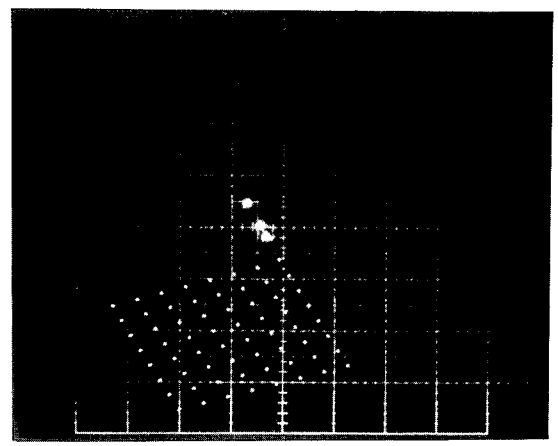

FIG. 23 comprises a set of four related views illustrating the cross-section of the period-three limit cycle, the prescaling being the same as for FIG. 21 and the rotation the same as for FIG. 22. The views are:
(a) the location of a cutting plane D, a $V_D$-$I_D$ plane passing through $V_s=r$ (negative value),
(b) waveforms of $I_D(t)$, $V_D(t)$ and $V_s(t)$ at the output of the sample-and-hold circuits in response to the comparator output signal C(t). The horizontal scale is 20 μsec., and the vertical scale is in 5-volt per divisions,
(c) a projection of the backward cross-section onto the $X_o$-$Y_o$ plane, and
(d) a projection of the forward cross-section onto the $X_o$-$Y_o$ plane.

Figure 24:
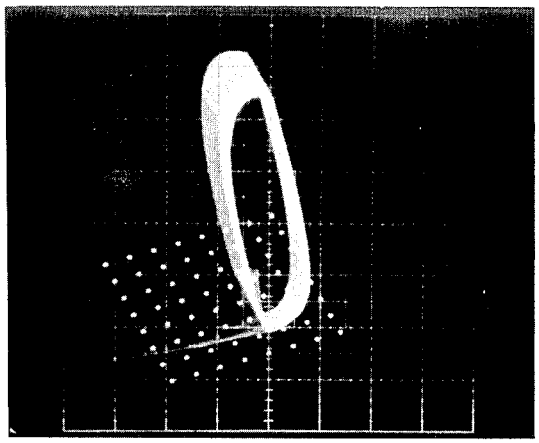
Figure 24:
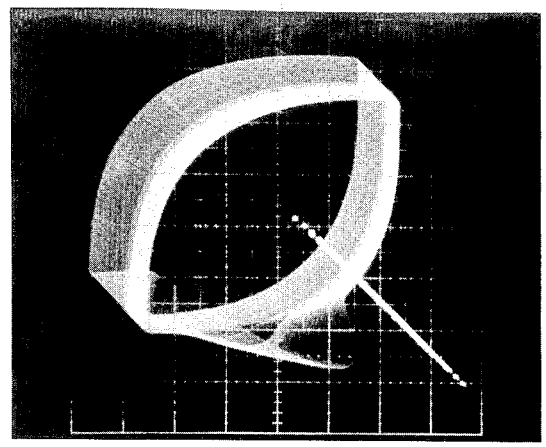
Figure 24:
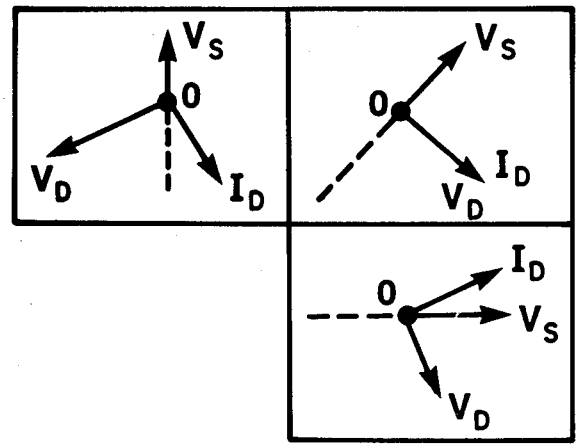
Figure 24:
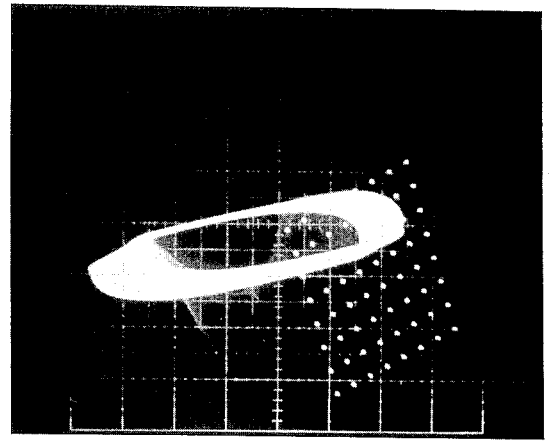
Figure 26:
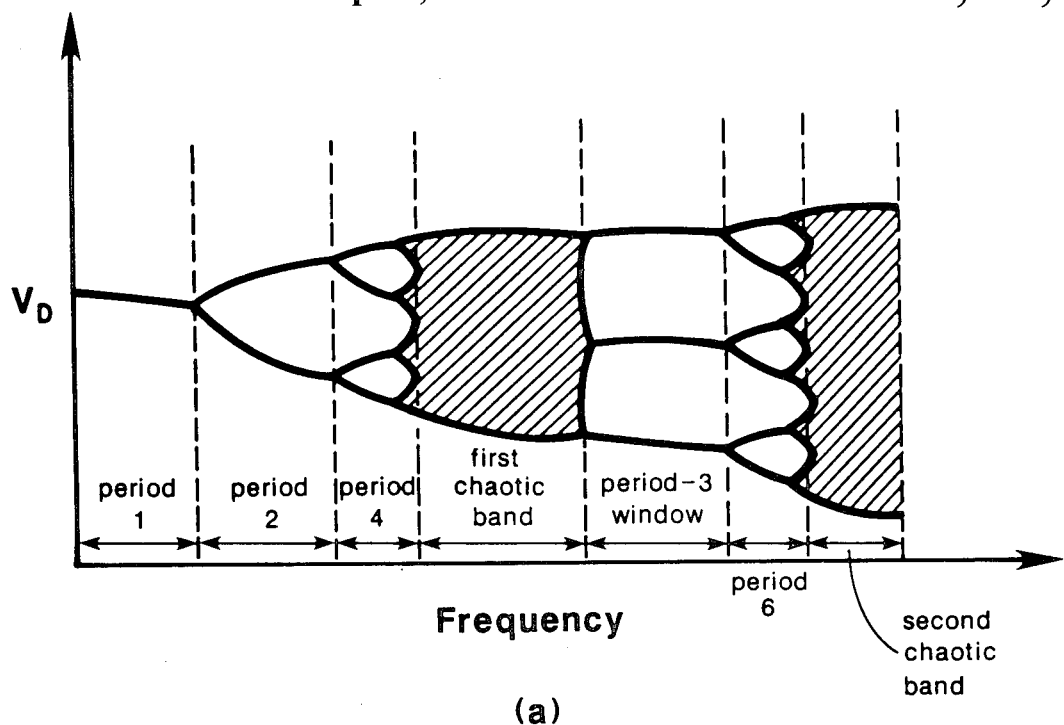
Figure 26:
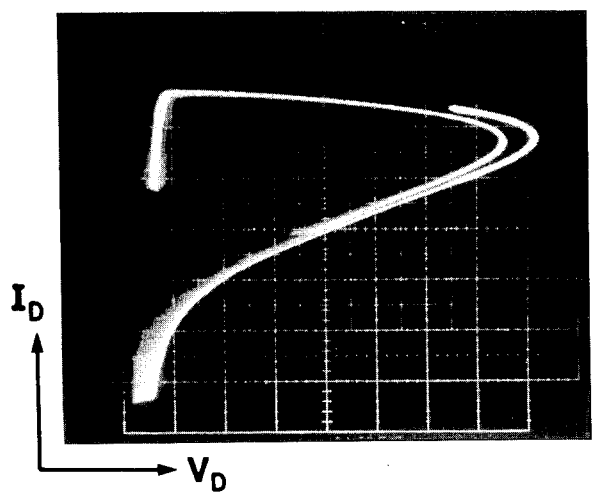
Figure 26:
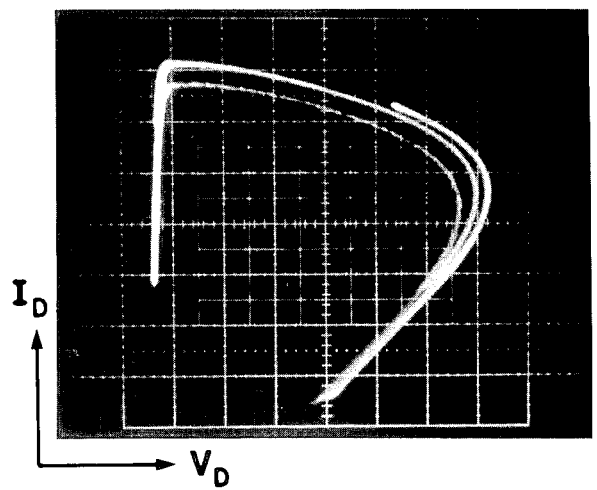

FIG. 24 comprises a set of four related views showing the projection of the attractor located at the first chaotic band in FIG. 26, the prescaling being the same as in FIG. 21, the rotation the same as in FIG. 22. The input signal $V_s$ is a 8.6 KHz triangular waveform. The views are
(a) a projection onto the $X_o$-$Y_o$ plane,
(b) a projection onto the $Z_o$-$Y_o$ plane,
(c) a projection onto the $Z_o$-$X_o$ plane,
(d) the location of the input coordinates. The three squares starting from the top left position in a clockwise direction correspond to (a), (b) and (c), respectively.

Figure 25:
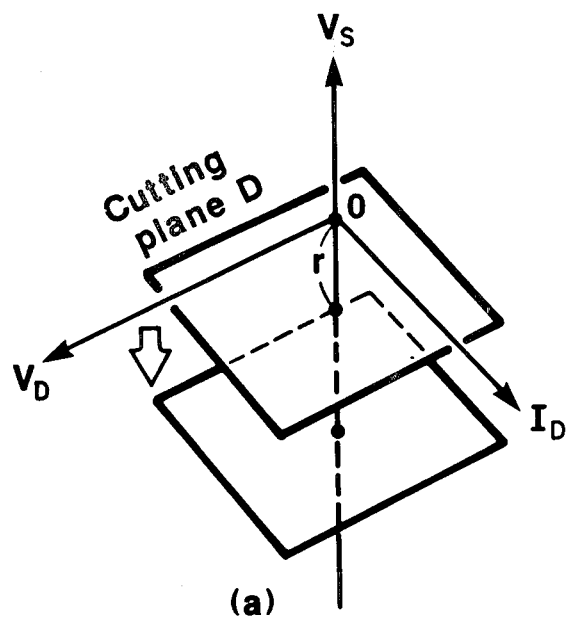
Figure 25:
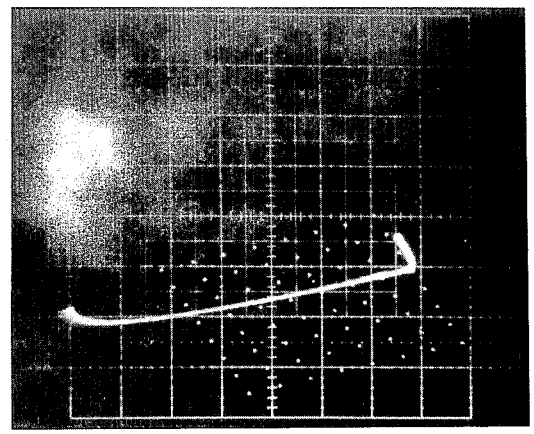
Figure 25:
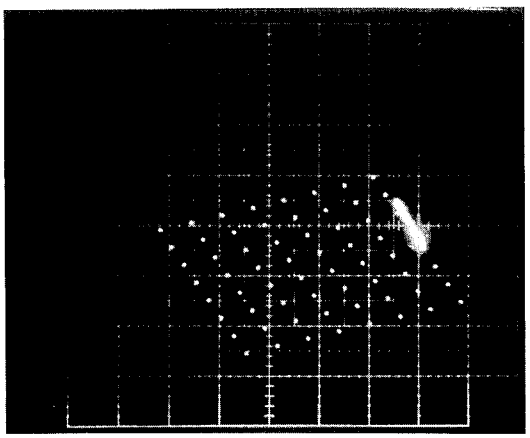
Figure 25:
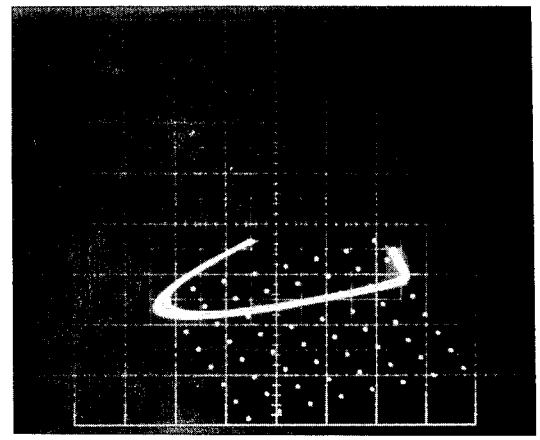
Figure 25:
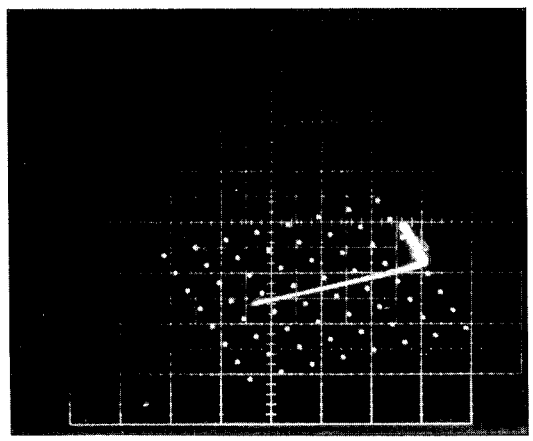
Figure 25:
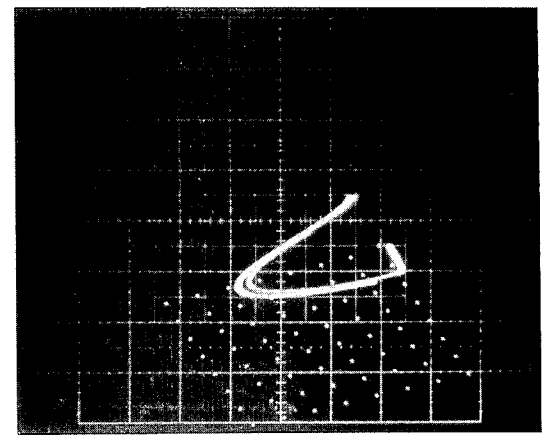

FIG. 25 comprises a set of six related views showing the cross-section of the attractor at the first chaotic band in FIG. 26. These pictures denote cross-sections of the rotated attractor in FIG. 24(a). The views show:
(a) the location of the cutting plane D, a $V_D$-$I_D$ plane passing through $V_s=r$ for different negative values of r, and
(b) (c), (d), (e), and (f) the backward cross-sections at $V_s=0$ V, $-1$ V, $-2$ V, $-2.5$ V, and $-3$ V, respectively.

FIG. 26 comprises three related views of a bifurcation tree and magnified backward cross-sections. The views are
(a) a qualitative sketch of the bifurcation tree diagram,
(b) a magnified version of FIG. 25 (cross-section at the first chaotic band), and
(c) a magnified backward cross-section at the second chaotic band where the input frequency is 12.0 KHz.

Figure 27:
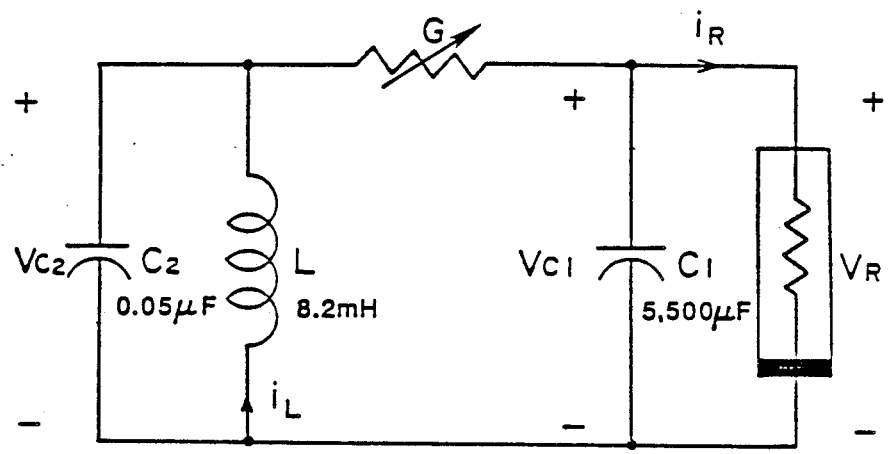
Figure 27:
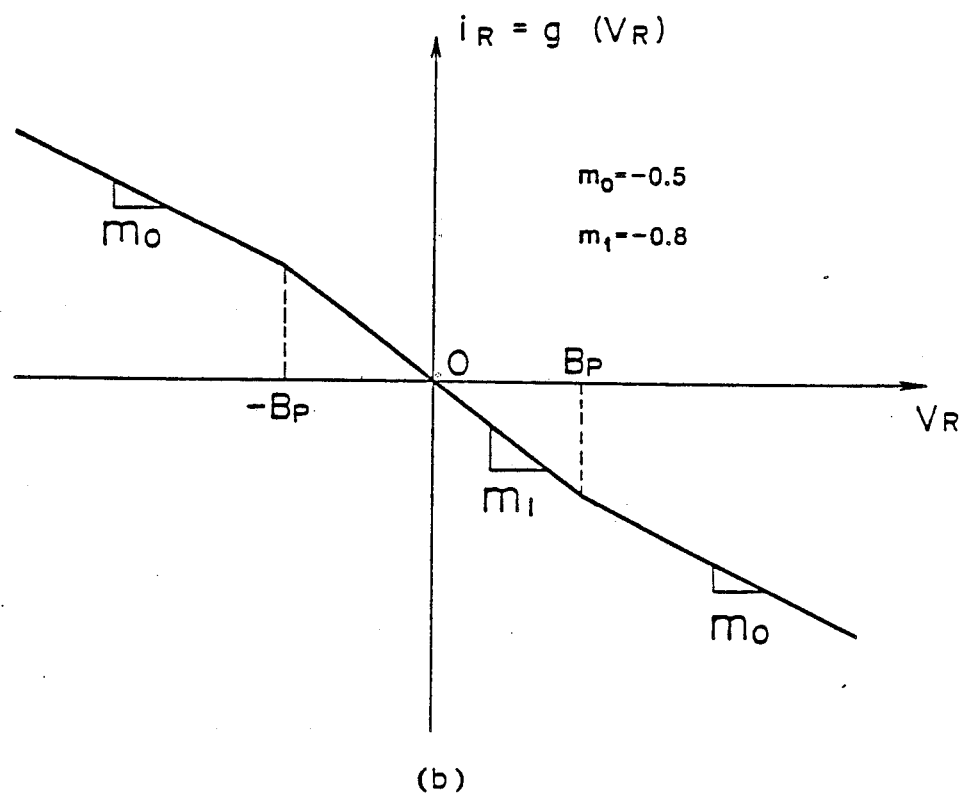

FIG. 27 comprises a pair of views relating to Chua's circuit. They show at
(a) the circuitry, and
(b) the constitutive relation of the nonlinear resistor.

Figure 28:
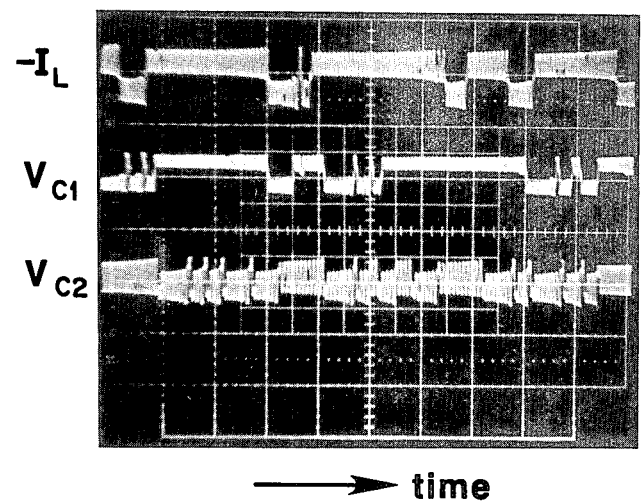

FIG. 28 is a CRT display of waveforms associated with the double scroll attractor, the prescaling being: $X=2\ V_{c1}$, $Y=-3,000(\Omega)I_L$, and $Z=10\ V_{c2}$. The horizontal scale is 1 msec per divisions, and the vertical scale is: 5 V per division.

Figure 29:
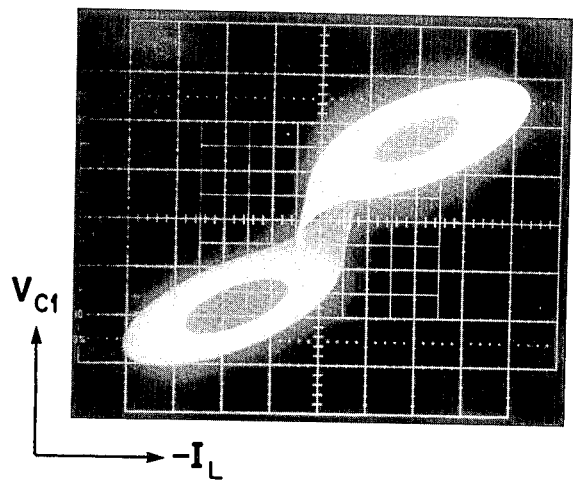
Figure 29:
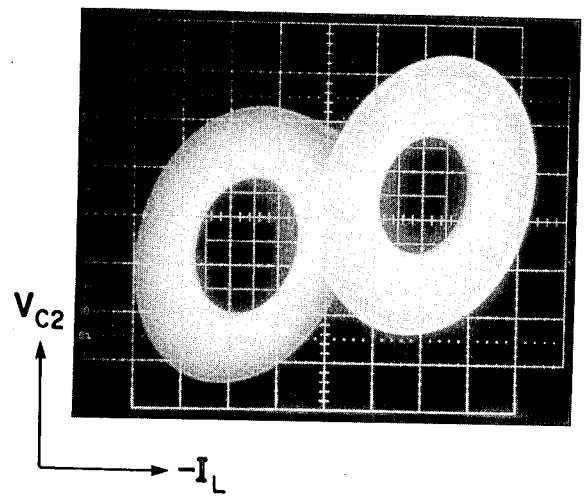
Figure 29:
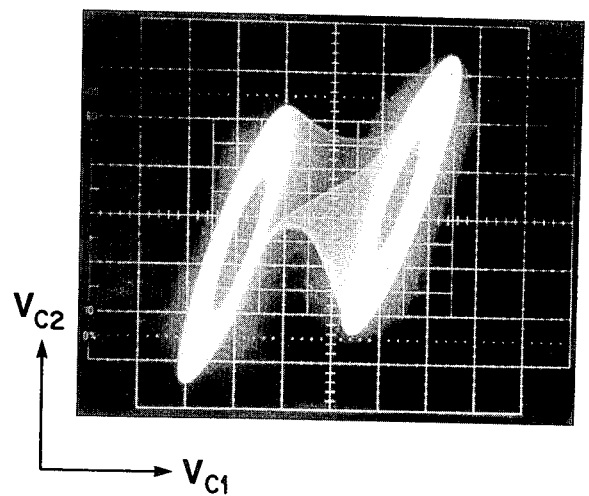

FIG. 29 is a set of three related projections of the unrotated double scroll attractor, the prescaling being the same as in FIG. 28, the horizontal scale being 2 V per division and the vertical scale 2 V per division. The views are:
(a) a projection onto the $(-I_L)-V_{c1}$ plane,
(b) a projection onto the $(-I_L)-V_{c2}$ plane, and
(c) a projection onto the $V_{c1}$-$V_{c2}$ plane.

Figure 30:
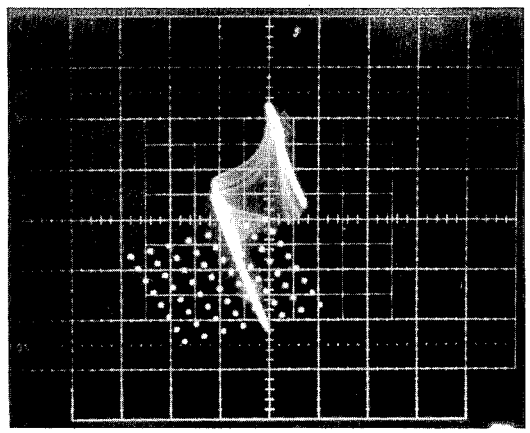
Figure 30:
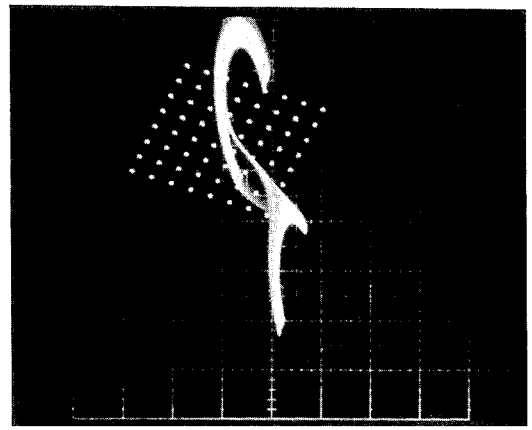
Figure 30:
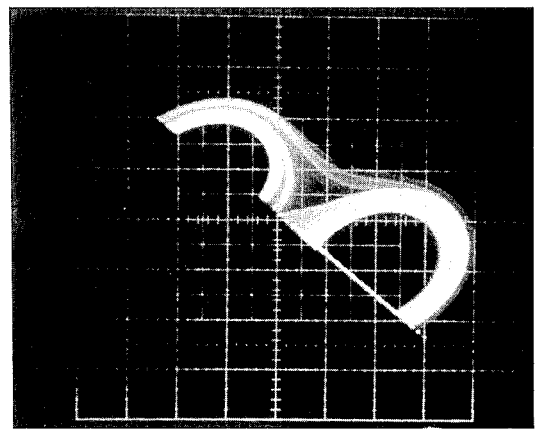
Figure 30:
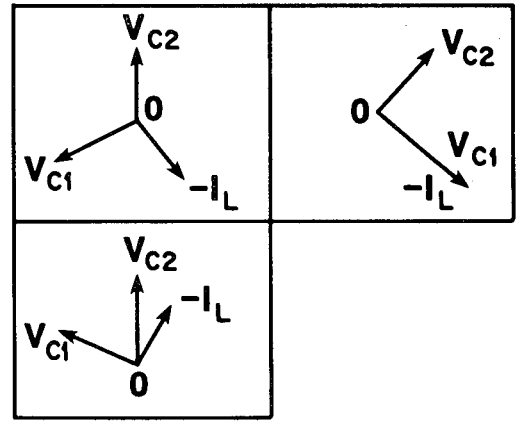

FIG. 30 is a set of four projections of a double scroll attactor after rotation, the prescaling being the same as in FIG. 28, the rotation: $\theta_x=-50.6°$, $\theta_y=-18.3°$, and $\theta_z=166.0°$. Horizontal scale: 2 V per division. Vertical scale: 2 V per division. The views are:

(a) a projection onto the $X_o$-$Y_o$ plane,
(b) a projection onto the $X_o$-$Z_o$ plane,
(c) a projection onto the $Z_o$-$Y_o$ plane, and
(d) the three locations corresponding respectively to (a), (b), and (c).

Figure 31:
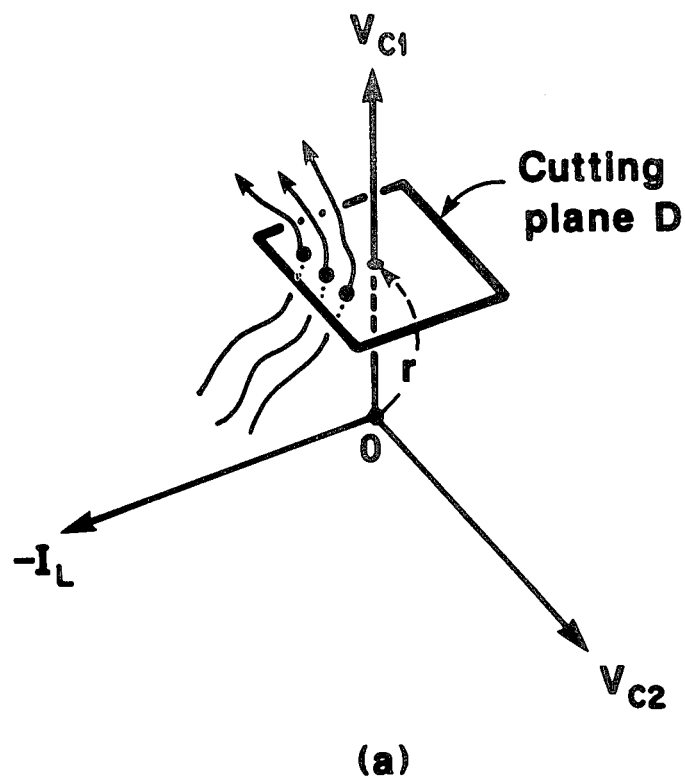
Figure 31:
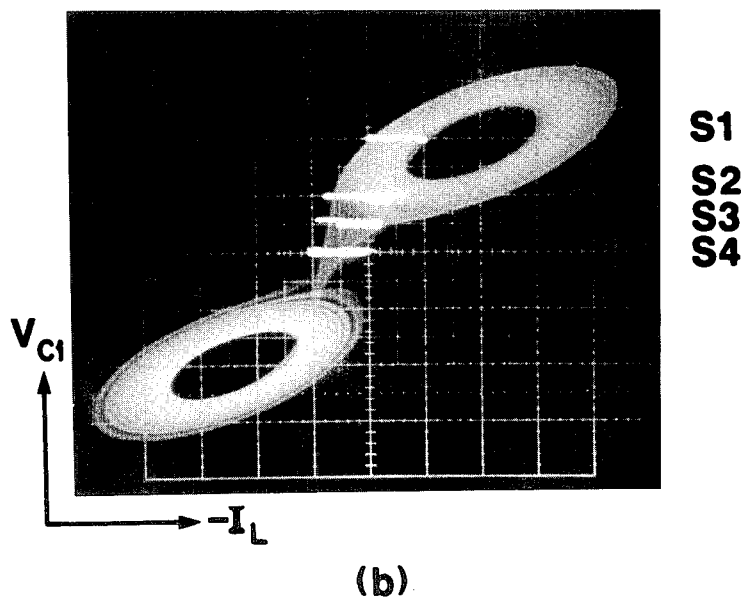

FIG. 31 comprises a pair of views relating to the cross-section of a three-dimensional strange attractor, the prescaling: $X = -3,000 \Omega I_L$, $Y = 10\ V_{c2}$, and $Z = 2\ V_{c1}$. Horizontal scale: 2 V per division. Vertical scale: 2 V per division. The views are:
 (a) the location of the cutting plane D, in this case a $(-I_L)-V_{c2}$ plane passing through $V_{c1} = r$, and
 (b) multiple exposures showing the projection of the double scroll attractor and four forward cross-sections S1, S2, S3 and S4 on the $(-I_L)-V_{c1}$ plane.

Figure 32:
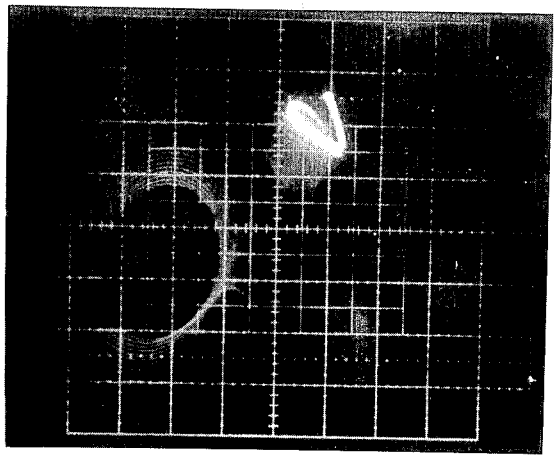
Figure 32:
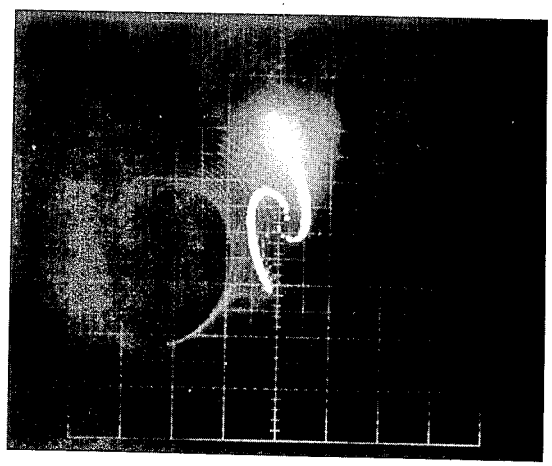
Figure 32:
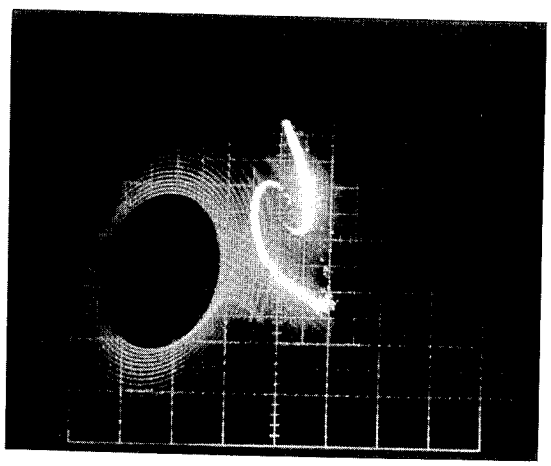
Figure 32:
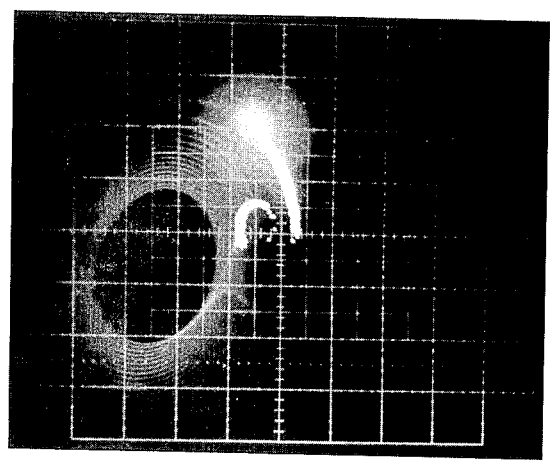

FIG. 32 comprises a set of four related views of forward cross-sections of the unrotated double scroll attractor, the prescaling being the same as in FIG. 31. Horizontal scale: 2 V per division. Vertical scale: 2 V per division. The views (a), (b), (c) and (d) are projections of the forward cross-sections S1, S2, S3 and S4 in FIG. 32(b) onto the $(-I_L)-V_{c2}$ plane, respectively.

Figure 33:
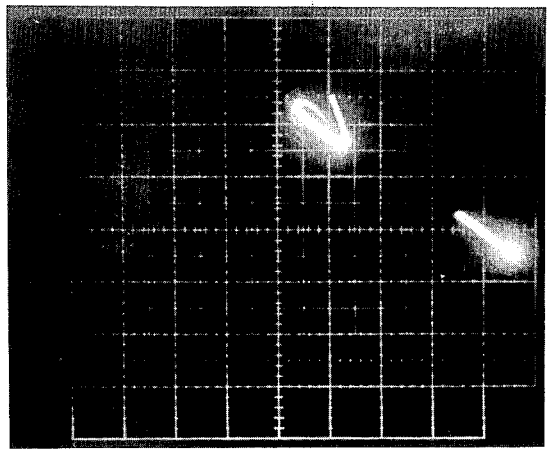
Figure 33:
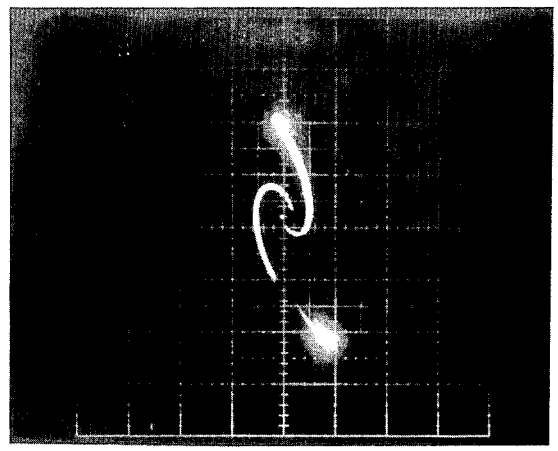
Figure 33:
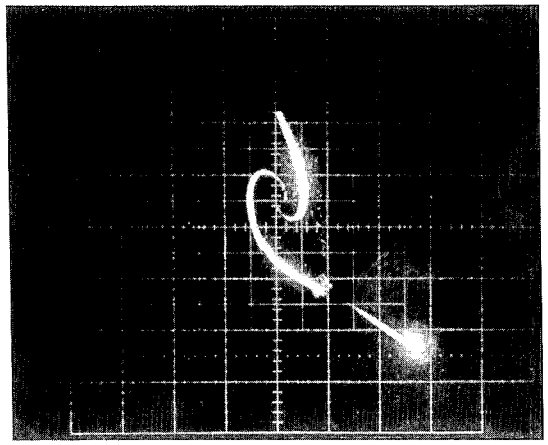

FIG. 33 comprises a set of three related views showing the forward and the backward cross-sections of the double scroll attractor. Prescaling: same as in FIG. 31. Horizontal scale: 2 V per division. Vertical scale: 2 V per division. The views (a), (b), and (c) are the forward and the backward cross-sections at S1, S2 and S3 in FIG. 31(b), respectively.

Figure 34:
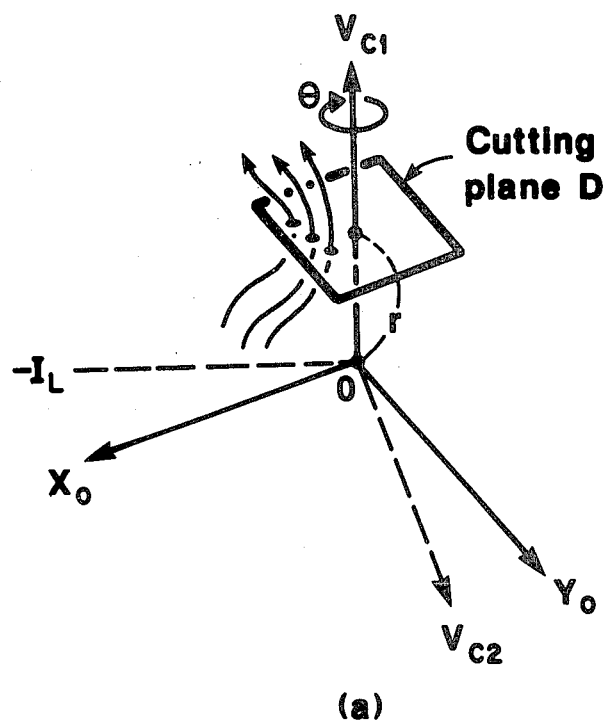
Figure 34:
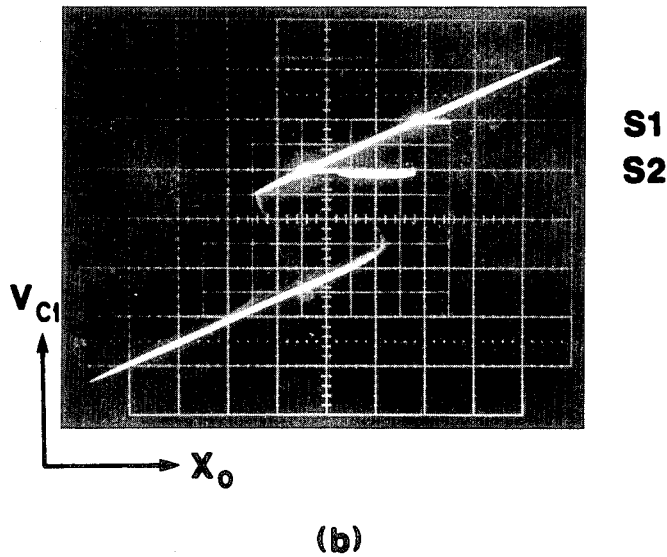

FIG. 34 comprises a pair of views relating to the projection of the double scroll attractor after a rotation around the $V_{c1}$-axis. Prescaling: same as in FIG. 31. Rotation: $\theta_z = 56.25°$. Horizontal scale: 2 V per division. Vertical scale: 2 V per division. The views are:
 (a) rotation around the $V_{c1}$-axis and the location of the cutting plane D, and
 (b) a projection of the double scroll attractor and two forward cross-sections S1 and S2 on the $X_o$-$V_{c1}$ plane ($X_o$-$Z_o$ plane).

Figure 35:
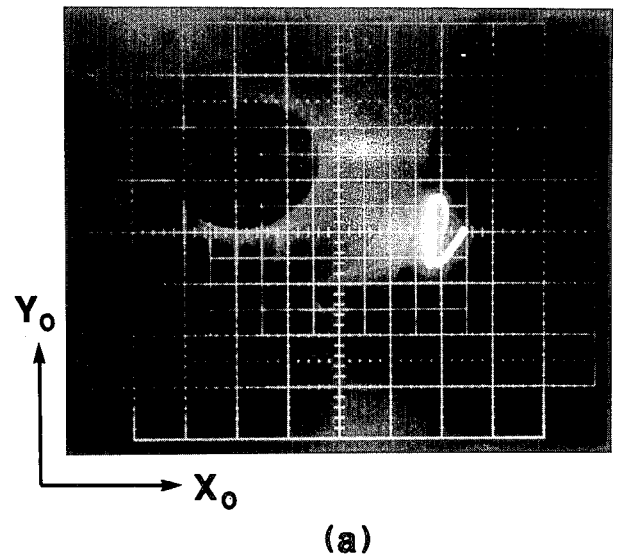
Figure 35:
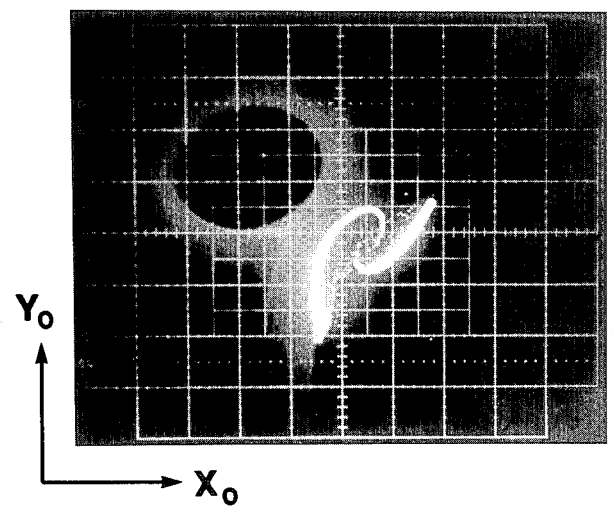

FIG. 35 comprises a pair of CRT displays of a forward cross-section after a rotation around the $V_{c1}$-axis. Prescaling: same as FIG. 31. Rotation: $\theta_x = 56.25°$. Horizontal scale: 2 V per division. Vertical scale: 2 V per division. The views (a) and (b) are projections of the forward cross-sections S1 and S2 onto the $X_o$-$Y_o$ plane, respectively.

FIG. 36 comprises a set of three CRT displays, being double exposures of the double scroll attractor and a cross-section: Prescaling: same as FIG. 31. The views are:
 (a) the entire surface of the double scroll attractor along with one cross-section after some rotation,
 (b) the upper surface and a backward cross-section, and
 (c) the lower surface and a forward cross-section.

1. General Description of the Invention

The invention is an electronic circuit for implementing orthogonal matrix transformations in any dimension. It may be termed an analog matrix multiplier.

Figure 1:
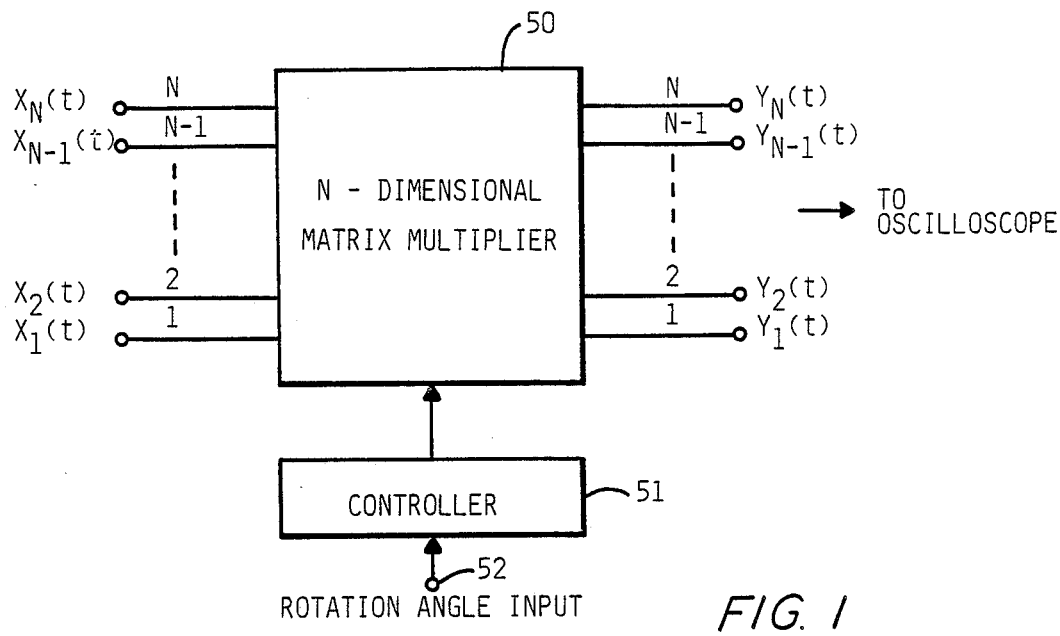
FIG. 1 is a block diagram of a generalized circuit embodying the generalized principles of the invention.

As shown in FIG. 1 there are at least two analog input signals $X_1(t)$, $X_2(t)$ and so on to $X_{N-1}(t)$ and $X_N(t)$, fed into a matrix multiplier 50. There may be any number of signals greater than two. These signals are voltages that vary with time and may be termed $X_1(t)$, $X_2(t)$ and so on to $X_n(t)$. The total analog input $X(t)$ over the total time T is $$X(t) = [X_1(t), X_2(t) \ldots X_N(t)]^T.$$

At least two analog output signals are obtained from the matrix multiplier 50. They may be termed $Y_1(t)$, $Y_2(t)$, etc., and the total output signal over the time T is $$Y(t) = [Y_1(t), Y_2(t) \ldots Y_N(t)]^T.$$

The matrix multiplier performs the operation $Y = QX$, where Q is an orthogonal matrix, such that $QQ^T = I$, where I is the identity matrix.

The input signals are provided to the matrix multiplier. Matrix multiplier constant controlling means control each element value of each matrix multiplication operator $q_1$, $q_2$, etc.

The output signals result, as said, from the matrix multiplier's operation on the input signals. Each multiplier constant of the matrix multiplier is controlled so that the matrix operator is always orthogonal.

The matrix multiplier 50 of FIG. 1 is controlled by a controller 51 that is supplied with a rotation angle input 52, and the matrix multiplier 50 is adapted to the number of dimensions, i.e., number of input signals. In each instance there are several sub-matrix or two-dimensional multipliers.

At the sub-matrix multipliers, where the number of input signals is greater than 2, two terminals are chosen from the N input terminals, and to these two terminals are connected to the input of a first sub-matrix multiplier 53, the other unselected terminals remaining unchanged. Next, the output of the first sub-matrix multiplier 53 and the unselected terminals are considered as the input terminals. There are N terminals. Then another combination of two terminals, which has not been chosen before, is connected to the second sub-matrix multiplier 54. This procedure is repeated until all of combinations are completed. There are $N!/2(N-2)!$ combinations.

Figure 2:
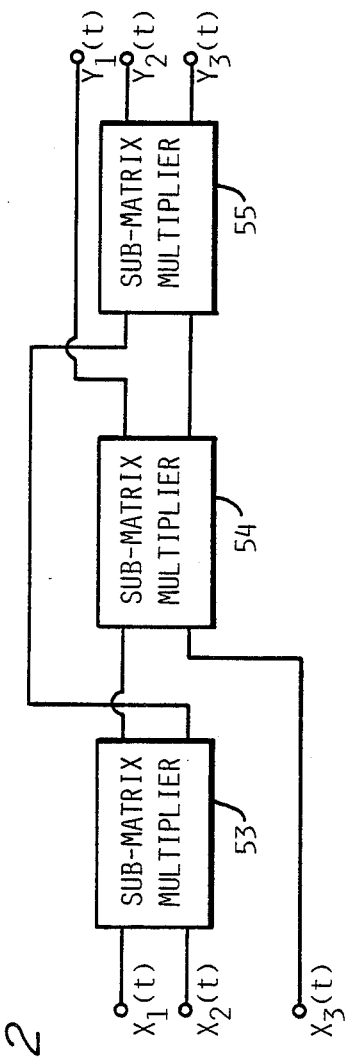
FIG. 2 is a block diagram of the matrix multiplier of FIG. 1, as made up of three sub-matrix multipliers, for application to a three-dimensional system.

For example, the case of N=3, as shown in FIG. 2, there are three sub-matrix multipliers 53, 54, and 55, because there are three possible combinations: [1,2], [1,3], and [2,3]. For the four-dimensional case, shown in FIG. 3, six sub-matrix multipliers 53, 54, 55, 56, 57, and 58 must be connected, because six distinct combinations [1,2], [1,3], [1,4], [2,3], [2,4] and [3,4] are possible.

The matrix multiplier controller 51 controls each sub-matrix multiplier 53, 54, 55, etc., so that each sub-matrix $R_k$ is an orthogonal two-dimensional matrix. In other words, each components of $R_k$ has $r_{1,1} = \cos(\theta_k)$, $r_{1,2} = \sin(\theta_k)$, $r_{2,1} = -\sin(\theta_k)$ and $r_{2,2} = \cos(\theta_k)$, where $\theta_k$ is a parameter called the rotation angle. Their input-output relation is given by $$Y1 = r_{11}X1 + r_{12}X2 \text{ and}$$

$$Y2 = r_{21}X1 + r_{22}X2$$

Figure 4:
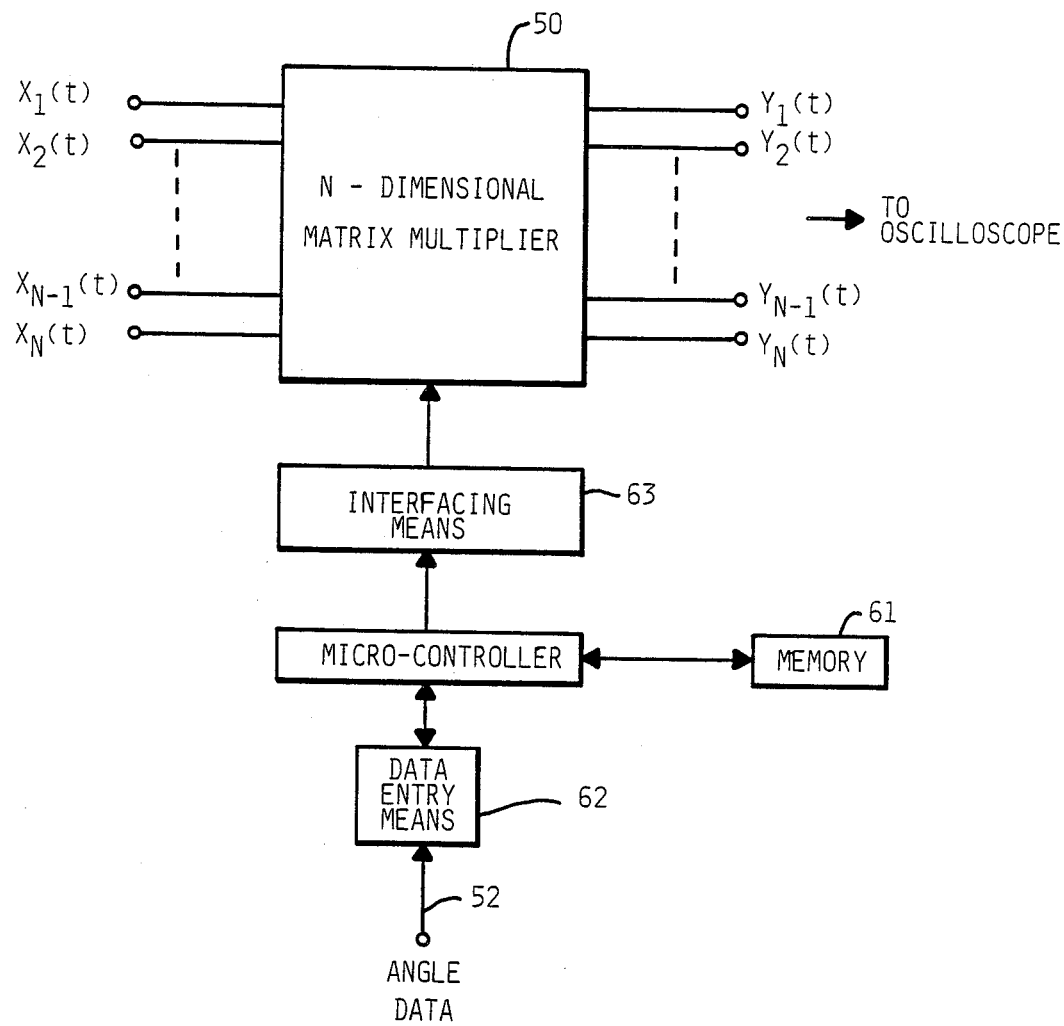
FIG. 4 is a block diagram corresponding to FIG. 1 with the elements of the controller shown.

Referring to FIG. 4, the multiplication constant controller 51 of FIG. 1 comprises a micro-controller 60 that executes a sequence of instructions which are stored in a memory 61 and generates all multiplication constants of the matrix multiplier 50, such that the matrix Q becomes orthogonal with the given rotation angles which are entered by a data entry means 62. The instructions of the micro-controller 60 are stored in the memory 61 which performs the following transformation digitally:
 (0) It reads the rotation angles $\theta k$ from the data entry means 52;
 (1) It sets Q = I and k = 1;

(2) It picks a combination [i,j] from the numbers 1,2, ..., N; if and when all of the combinations are already picked it goes to (11);
(3) It sets the matrix R=I;
(4) It sets $r_{i,i}=\cos(\theta_k)$;
(5) It sets $r_{j,j}=\cos(\theta_k)$;
(6) It sets $r_{i,j}=\sin(\theta_k)$;
(7) It sets $r_{j,i}=-\sin(\theta_k)$;
(8) It multiplies R and Q and stores the result into Q;
(9) It raises k by one digit
(10) It then goes to step (2) and repeats steps 2-9;
(11) It outputs all the multiplication constants of Q, $q_{i,j}$ to the matrix multiplier 50.

The control signals from the micro-controller 60 are fed to the matrix multiplier array 50 by suitable interfacing means 63.

To make an orthogonal matrix, the matrix Q is broken down into a sequence of matrix multiplications. What is looked for are some convenient parameters which uniquely determine the matrix Q. Usually these parameters are rotation angles, because these parameters are well understood if the dimensions are fewer than four.

One might think the transform as a combination of rotations around each axis. In the three-dimensional case, this observation is true, because after choosing two coordinates, only one remains, namely, the rotation axis. However, it is *not true* in the general case. There, the transform is a combination of rotations in two-dimensional sub-spaces. While a two-dimensional sub-space can be defined, an axis of rotation, when the dimension exceeds three, cannot be defined. Since all combinations to generate an orthogonal matrix must be performed $n!/2(N-2)!$ combinations (or sub-spaces) must be included.

Figure 3:
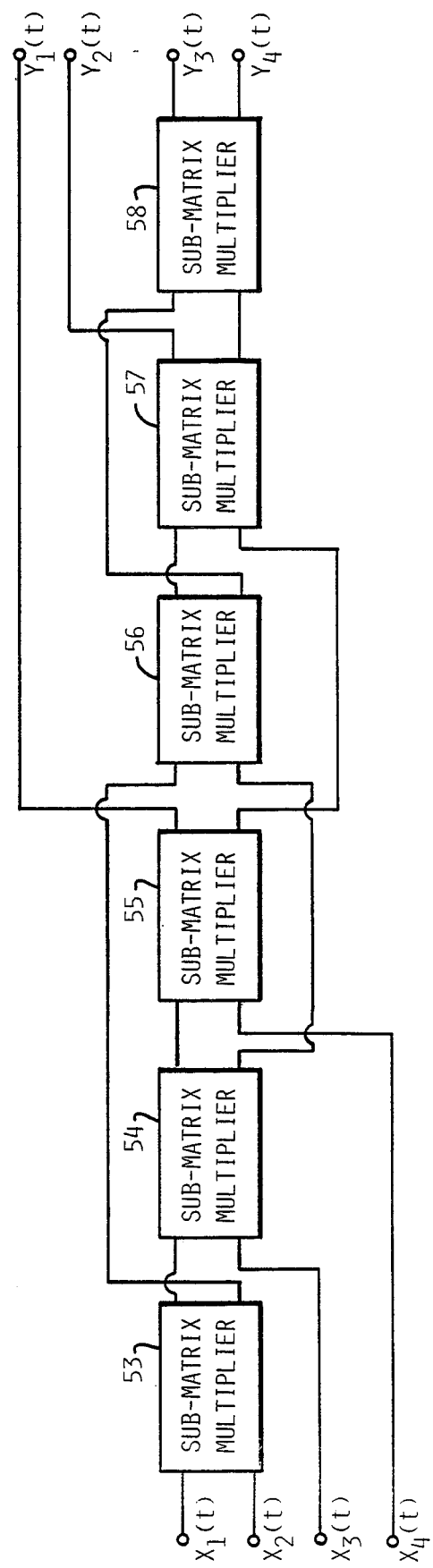
FIG. 3 is a similar block diagram for a four-dimensional system, necessarily employing six sub-matrix multipliers.

For example, in the four-dimensional case of FIG. 3 six rotations must be performed in different two-dimensional sub-spaces, so that any orthogonal matrix Q can be generated. What this breakdown of Q means, is that the orthogonal matrix can be fully controlled by six parameters, i.e., six rotation angles for each two-dimensional sub-space.

2. Description of a Preferred Three-dimensional Embodiment

The apparatus of this invention is an electronic instrument for displaying any perspective of a three dimensional surface S generated by three time-varying (not necessarily periodic) signals. The surface S is a three dimensional Lissajous figure which need not be a closed curve; it is typical of all *strange attractors*. This analog (not digital) instrument is designed to rotate S along *any* axis (not just the X, Y, Z-axis) through any prescribed solid angles (0°-360°) in the three dimensional coordinate system in *real time*.

The particular instrument herein described, works as a preprocessor for a standard oscilloscope and is built with components capable of displaying time-varying signals with a frequency spectrum from 0 to 20 K Hz. Different frequency spectra may be used by modifying the instrument.

To illustrate some immediate applications of this instrument, strange attractors associated with both *autonomous* (Chua's circuit) and *non-autonomous* (Series RL-diode circuit) circuits are presented in many different perspectives and cross-sections. In particular, numerous cross-sections of these strange attractors which have never been seen before can be easily displayed in any desired perspective in real time. Such cross-sections have proved to be most revealing and invaluable in dissecting and uncovering the fine structures of strange attractors.

Figure 5:
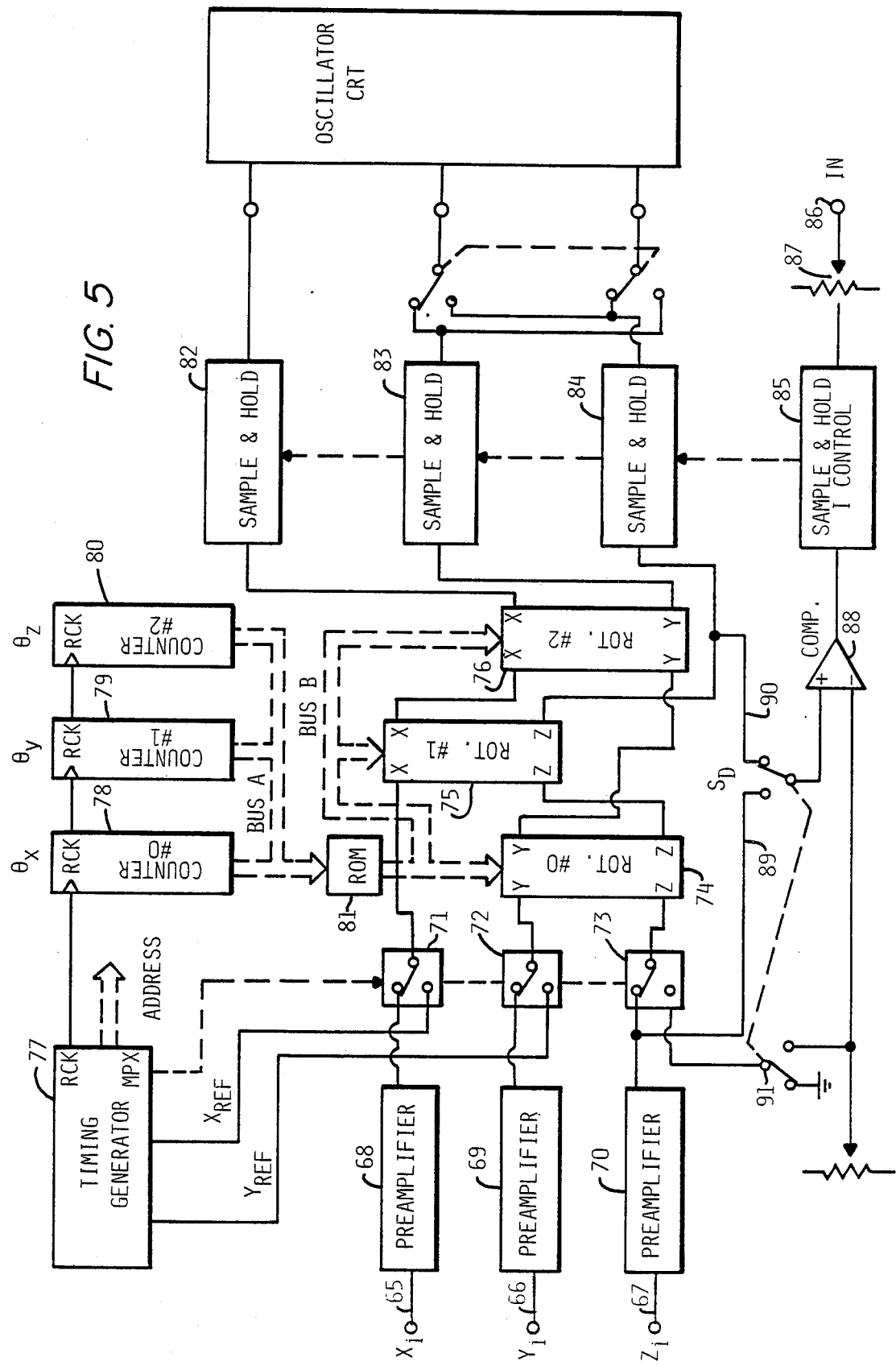
FIG. 5 is a detailed block diagram of a circuit embodying the principles of the invention.

As shown in FIG. 5, three electrical signals $X_i$, $Y_i$, and $Z_i$ are fed into terminals 65, 66, and 67. These terminals preferably feed these signals to respective preamplifiers 68, 69, and 70. It is not always necessary to use preamplifiers, but often their use is helpful to ensure uniformity of the input signal levels. From the preamplifiers these signals respectively go to ganged switches 71, 72, and 73. When these switches are in their upper position, as they are shown in FIG. 5, the Z signal from the switch 73 goes to a two-dimensional rotator 74, which also receives the Y signal from the switch 72. The rotator 74 then becomes a YZ two-dimensional rotator which provides signals corresponding to a projection onto the YZ plane. The X signal from the switch 71 goes to another two dimensional rotator 75, which also receives a Z signal from the rotator 72, switch 59. The X signal from the rotator 75 and the Y signal from the rotator 74 are fed to a third two-dimensional rotator 76.

These three two-dimensional rotators 74, 75, and 76 are combined in a way to produce three-dimensional rotation which, with the aid of this circuit, becomes continuous rotation. In order to do this, there is first a timing generator 77, which includes also a reference plane generator, that feeds a Y reference staircase signal to the switch 72 and an X reference staircase signal to the switch 71, so that when the ganged switches 71, 72, and 73 are thrown to their other position, the timing generator signals $X_{ref}$ and $Y_{ref}$ pass to the rotators 75 and 74, respectively, instead of the respective X and Y signals from the pre-amplifiers 69 and 70.

The timing generator 77 (as will be explained below in reference to FIG. 8) also sends a signal to three counters 78, 79, and 80 in sequence. These counters will be further explained below with reference to FIG. 9. The counter 78 provides the angles $\theta_x$; the counter 79 provides the angles $\theta_y$; and the counter $\theta_z$ provides the angles $\theta_z$. The outputs $\theta_x$, $\theta_y$, and $\theta_z$ from these three counters 78, 79, and 80 are fed to a bus A which feeds them to a trigonometric function ROM 81. The ROM 81, (as will be explained below with reference to FIG. 10) itself sends multiplication signals to a bus B which takes them to the three two-dimensional rotators 74, 75, and 76, as is explained below with reference to FIGS. 6 and 7. These are the three controlling signals for the two-dimensional rotators.

The X output from the rotator 76 goes to a sample and hold unit 82, while the Y signal from the rotator 76 goes to a sample and hold unit 83, and the Z signal from the rotator 75 goes to a sample and hold unit 84. These sample and hold units 82, 83, and 84, (as will be explained further in connection with FIG. 12) are controlled by a sample-and-hold control circuit 85.

The control unit 85 receives two signals. A current is fed to a terminal 86 and goes via a potentiometer 87, which determines intensity, to the control unit 85. The control unit 85 also receives a signal from a comparator 88. For this purpose a Z reference signal may be taken just ahead of the switch 73 via a line 89 and sent to a normally open terminal of a switch $S_D$. Similarly, a Z signal may be taken between the rotator 75 and the sample and hold unit 84 via a line 90 and sent to a normally closed terminal of the switch $S_D$. The switch 73 has a terminal with a lead to a switch 91 which normally goes to ground; however, the switch 91 is ganged with the switch $S_D$, so that either the Z signal in the lead 90 or the Z reference signal from the lead 89 goes to the plus side of the comparator 88. When the switch $S_D$ is thrown to open the connection between the Z signal 67 and the rotator 74, the switch 91 then connects the switch 73 to a point r, which connects a potentiometer to the negative side of the comparator 88. In this manner, the alternation of the ganged switches $S_D$ and 80 acts to display the main X, Y, Z signals in alternation with a reference plane. This can be done so quickly that, to the eye, they appear to be displayed simultaneously on the oscilloscope.

Figure 6:
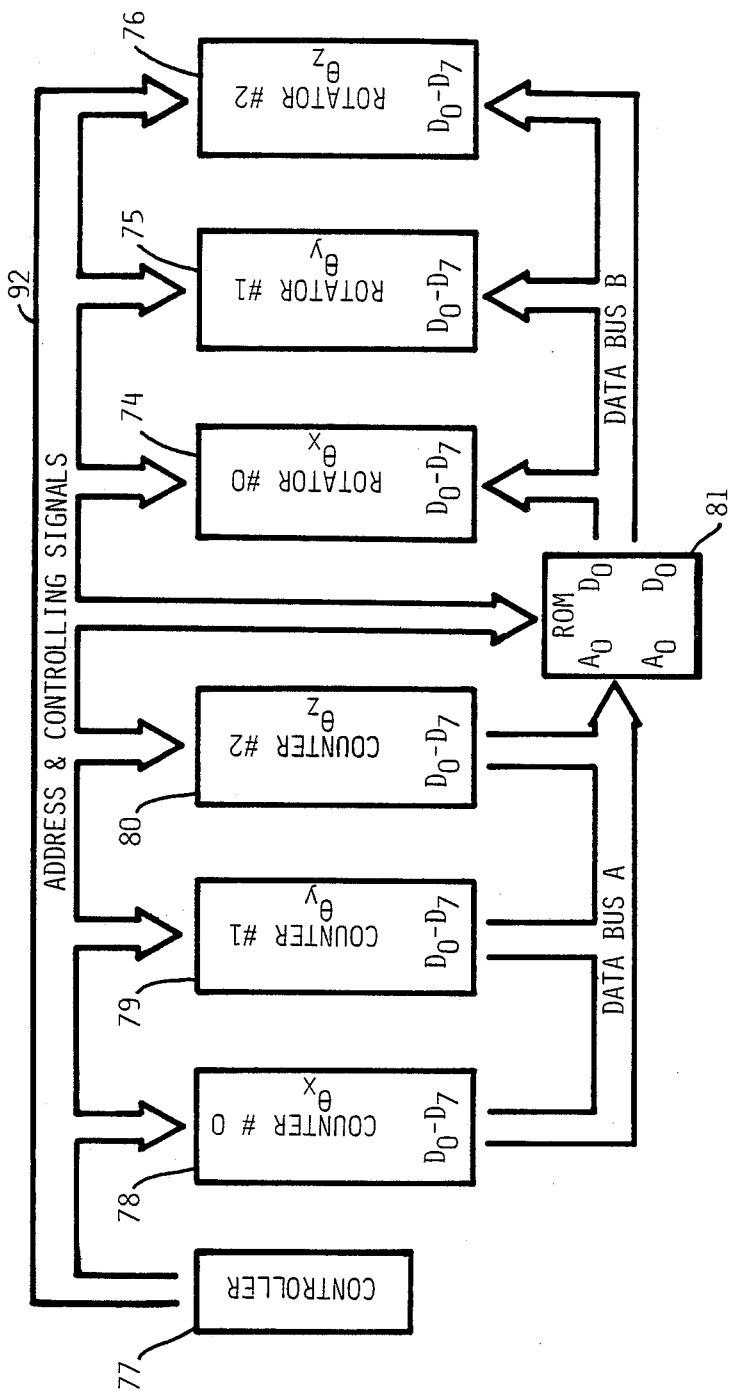
FIG. 6 is a block diagram of the bus structure for the rotators of FIG. 5, showing that a data bus A is shared by the three rotation angle counters, and that data from the bus A is converted into corresponding multiplying constants by a ROM. A data bus B supplies the multiplying constants to the three rotators, while a third bus provides address and controlling signals.

Referring now to FIG. 6 it will be seen that two data buses, data bus A and data bus B, are used to control the rotators 74, 75, and 76. The data bus A is shared by the three rotation-angle counters 78, 79, and 80. Data from the data bus A are converted into corresponding multiplying constants by the ROM 81. Data from a bus B supplies these multiplying constants to the rotators 74, 75, and 76 respectively.

To control different parts of the instruments, address and controlling signals 92 are provided to all of the counters 78, 79, and 80, the rotators 74, 75, and 76 and the ROM 81. Because of the use of the bus structure, i.e., buses A, B, and 92, extensions to higher dimensional rotators can be done easily without changing the interface; what is given here is simply an example.

Figure 7:
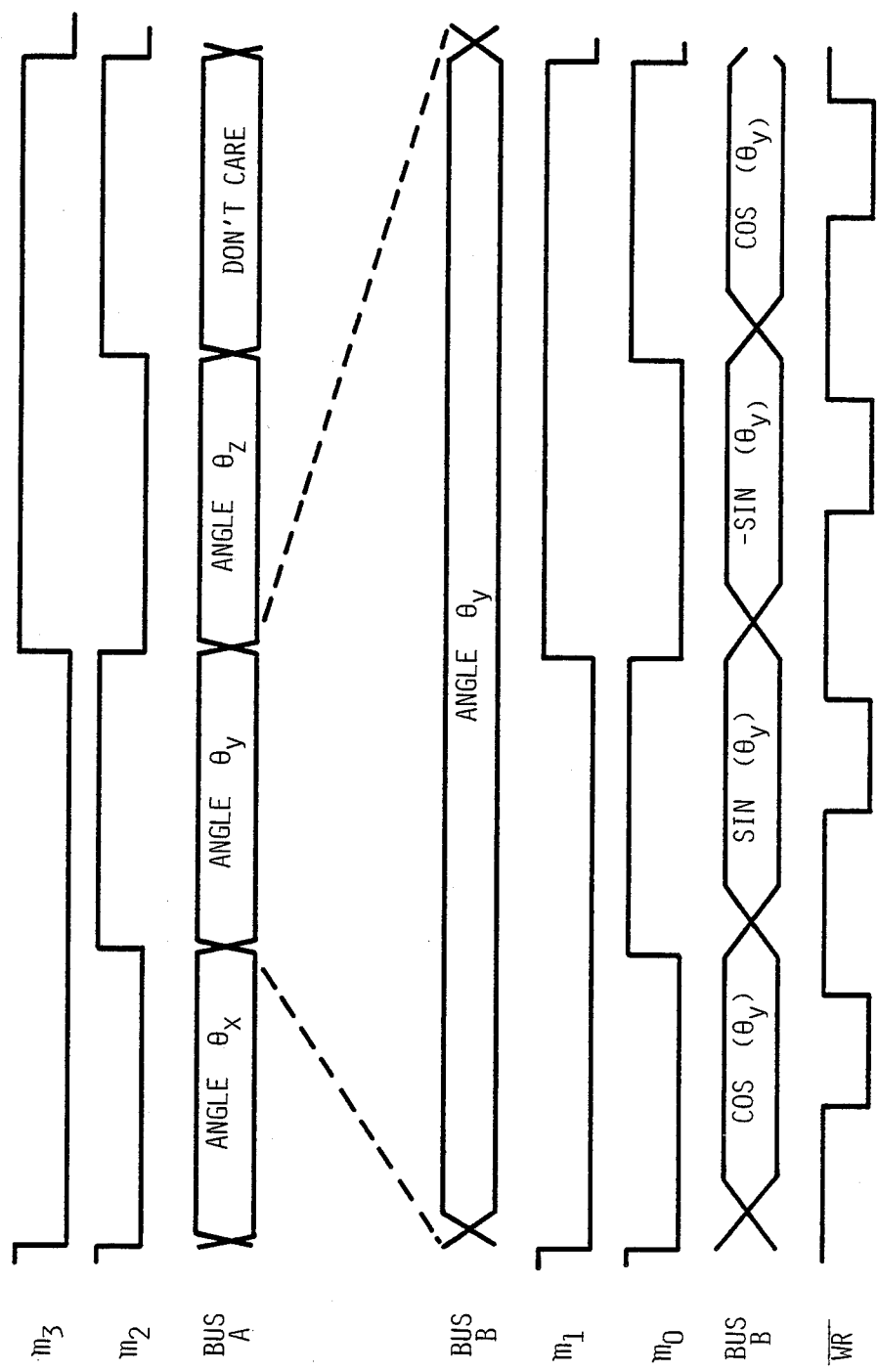
FIG. 7 is a bus timing chart: each counter outputs its data into the bus A according to its address as determined by signals m2 and m3. The data on the bus A is then converted into four multiplying constants by a ROM, where address signals, m0 and m1 are used to select the corresponding function table in the ROM. These data are placed on bus B so that the multipliers can read their multiplying constants.

FIG. 7 is a bus timing chart. Each counter 78, 79, and 80 outputs its data into the bus A according to the addresses determined by the rotator element address signals m2 (LSB) and m3 (MSB). The data on the bus A is converted into four multiplying constants by the ROM 81, where rotator address signals m0 (LSB) and m1 (MSB) are used to select the corresponding function table in the ROM. The bus A sets the rotation angle at $$(\theta = D \times \pi / 128)$$

and the bus B provides the multiplying constants $$(r = D/128 - 1.0).$$

The signal $\overline{wr}$ means "write-enable when wr is false". These data are placed on the bus B, so that the multiplier can read their multiplying constants.

FIG. 7 shows when the address signals m0, m1, m2, and m3 are on and off. The bus A shows the angle of $\theta_y$, which is on all the time in this example, as compared with the angles for $\theta_x$ and $\theta_z$ and another for $\theta_y$ while that says in effect, "don't care". Bus B changes from the cosine of $\theta_y$ to +sine of $\theta_y$ to −sine of $\theta_y$ to the cosine of $\theta_y$ again. These changes result in rotation of the main signals.

Figure 8:
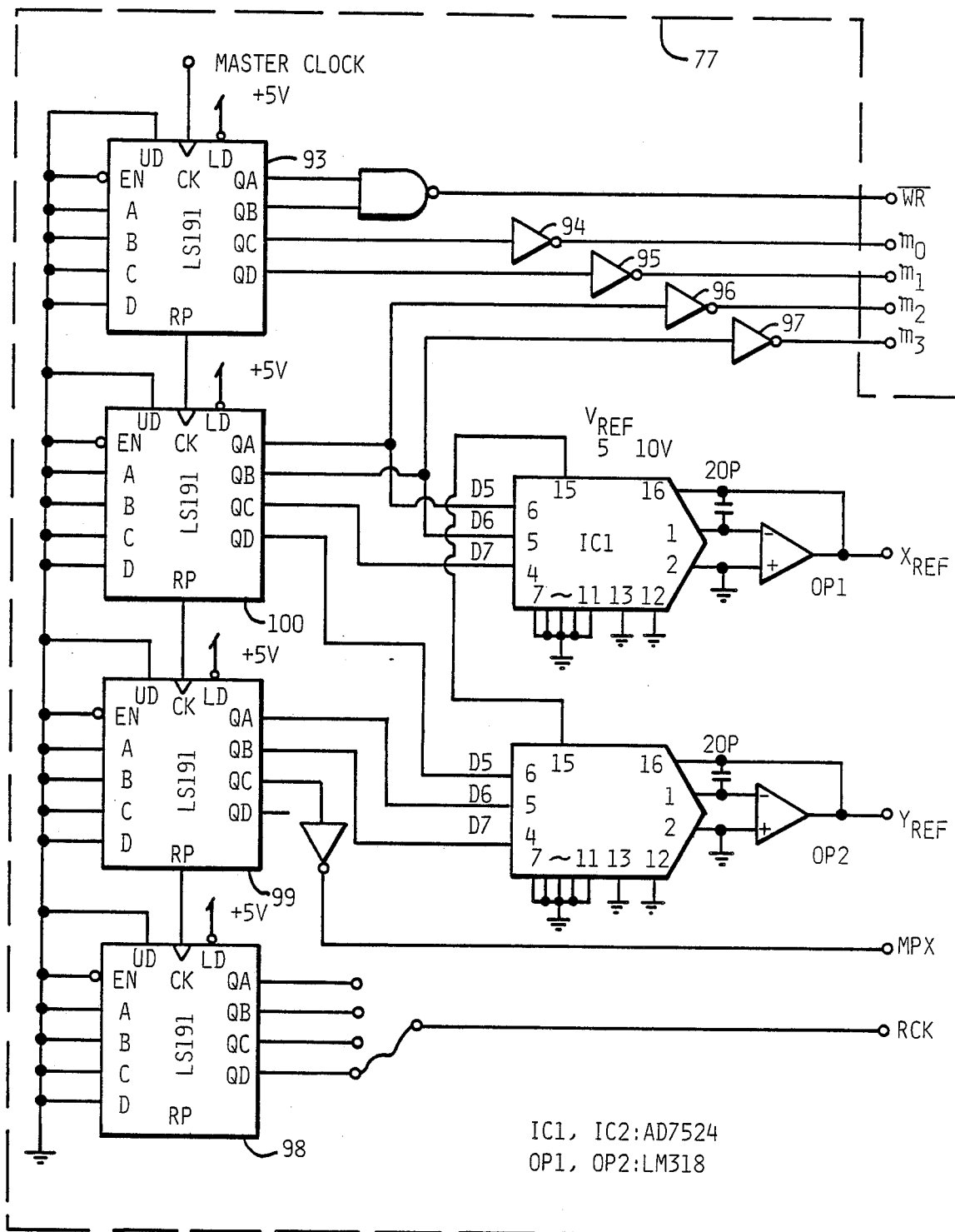
FIG. 8 is a diagram of a controlling circuit and reference generator for a device embodying the invention.

FIG. 8 is a diagram of the controlling circuit and reference generator of this device. It includes four LS 191 chips and several logic elements. The first LS 191 chip 93 generates the four address signals m0, m1, m2, and m4 through four inverters 94, 95, 96, and 97 and a write-enable signal $\overline{wr}$. The final LS 191 chip 98 provides the clock signal RCK for the angle counters 78, 79, and 80. The third LS 191 chip 99 generates a multiplex signal MPX and cooperates with the second LS 191 chip 100 to generate two staircase signals $X_{ref}$ and $Y_{ref}$ for displaying a reference plane.

Figure 9:
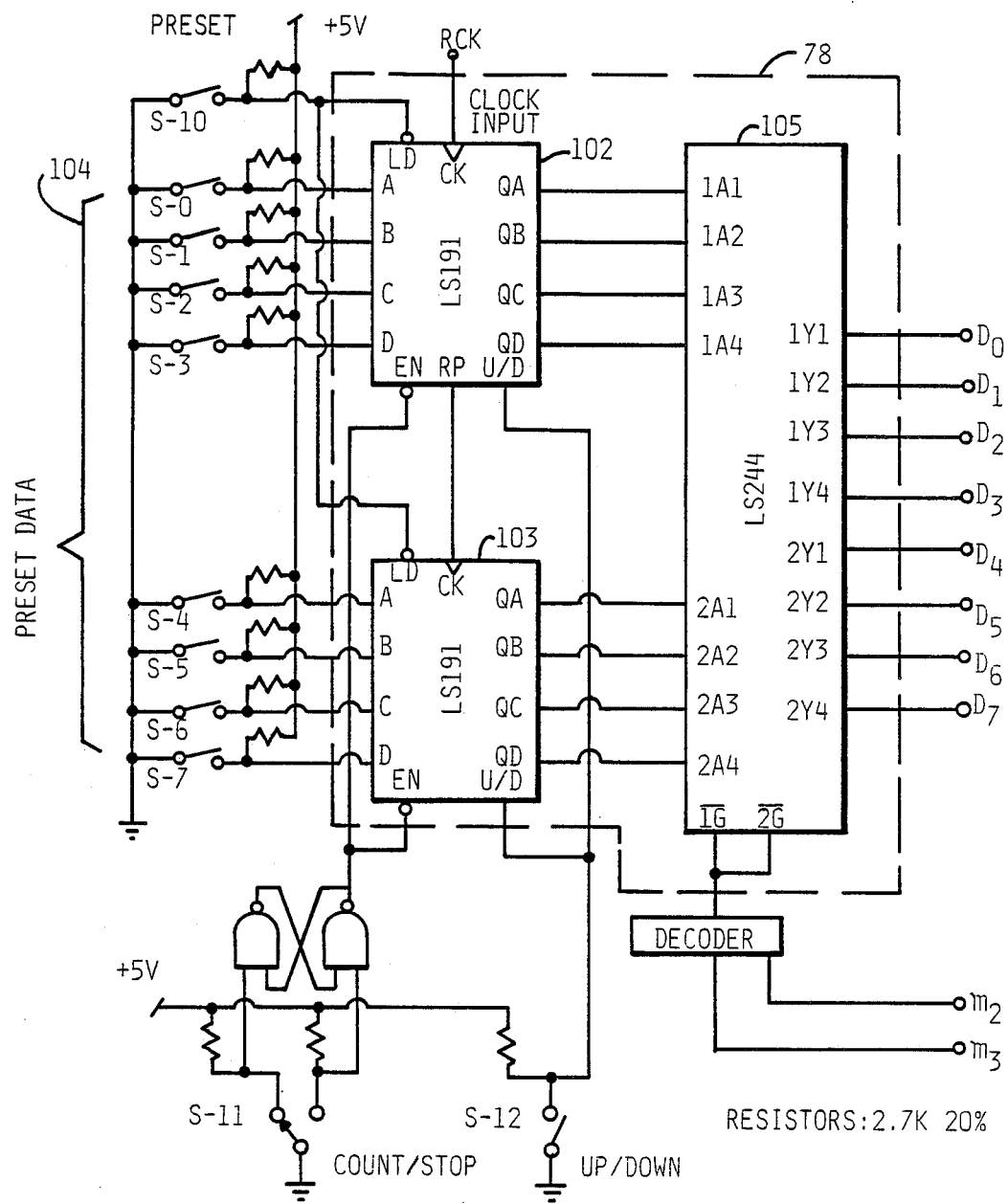
FIG. 9 is a circuit diagram of one of the three identical rotation angle counters of FIG. 5.

FIG. 9 is a circuit diagram of one of the rotation angle counters and gives an example of the rotation angle entry circuit. It comprises two LS 191 chips 102 and 103 (which are binary counters, a synchronous up-down counter, a standard chip which is widely available in different power ratings), a preset data array 104 of switches and resistors, and an LS 244 chip 105 with eight-bits of output. (This is a standard component, widely available; sometimes called an octal buffer or a line driver.) This is used when continuous rotation is desired. For continuous rotation, to change the angle continuously in time, the LS 191 counters count the pulses from the clock RCK and increment or decrement the angle data $\theta$. If continuous rotation is not required, the circuit of FIG. 9 may be replaced by an eight-bit switch.

Figure 10:
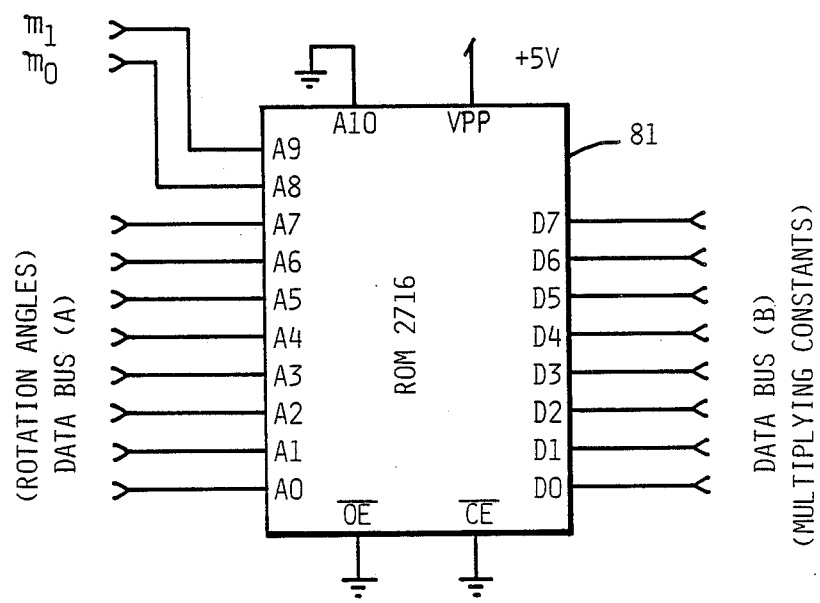
FIG. 10 is a circuit diagram of a function ROM suitable for use in the circuit of FIG. 5.

FIG. 10 is a circuit diagram of an eight-bit function ROM 81 that can be used in the invention. The address of the ROM 81 is classified by an A0 to A7 terminal for input for the data bus A and D0 to D7 output to the data bus B. There is also input for the signals m0 and m1. The data of bus B is simply output from the ROM memory. The actual data of the ROM is shown in Table 1.

TABLE 1

| | 000H 0FFH COS($\theta$)(SAME FOR 300H 3FFH) | | | | | | | | | | | | | | | |
|---|---|---|---|---|---|---|---|---|---|---|---|---|---|---|---|---|
| 0: | FF | FF | FF | FF | FE | FE | FE | FD | FD | FC | FB | FA | FA | F9 | F8 | F6 |
| 10 | F5 | F4 | F3 | F1 | F0 | EE | ED | EB | EA | E8 | E6 | E4 | E2 | E0 | DE | DC |
| 20: | DA | D7 | D5 | D3 | D0 | CE | DB | C9 | C6 | C4 | C1 | BE | BC | B9 | B6 | B3 |
| 30: | B0 | AD | AA | A7 | A5 | A2 | 9E | 9B | 98 | 95 | 92 | 8F | 8C | 89 | 86 | 83 |
| 40: | 80 | 7C | 79 | 76 | 73 | 70 | 6D | 6A | 67 | 64 | 61 | 5D | 5A | 58 | 55 | 52 |
| 50: | 4F | 4C | 49 | 46 | 43 | 41 | 3E | 3B | 39 | 36 | 34 | 31 | 2F | 2C | 2A | 28 |
| 60: | 25 | 23 | 21 | 1F | 1D | 1B | 19 | 17 | 15 | 14 | 12 | 11 | F | E | C | B |
| 70: | A | 9 | 7 | 6 | 5 | 5 | 4 | 3 | 2 | 2 | 1 | 1 | 1 | 0 | 0 | 0 |
| 80: | 0 | 0 | 0 | 0 | 1 | 1 | 1 | 2 | 2 | 3 | 4 | 5 | 5 | 6 | 7 | 9 |
| 90: | A | B | C | E | F | 11 | 12 | 14 | 15 | 17 | 19 | 1B | 1D | 1F | 21 | 23 |
| A0: | 25 | 28 | 2A | 2C | 2F | 31 | 34 | 36 | 39 | 3B | 3E | 41 | 43 | 46 | 49 | 4C |
| B0: | 4F | 52 | 55 | 58 | 5A | 5D | 61 | 64 | 67 | 6A | 6D | 70 | 73 | 76 | 79 | 7C |
| C0: | 80 | 83 | 86 | 89 | 8C | 8F | 92 | 95 | 98 | 9B | 9E | A2 | A5 | A7 | AA | AD |
| D0: | B0 | B3 | B6 | B9 | BC | BE | C1 | C4 | C6 | C9 | CB | CE | D0 | D3 | D5 | D7 |
| E0: | DA | DC | DE | E0 | E2 | E4 | E6 | E8 | EA | FB | ED | EE | F0 | F1 | F3 | F4 |
| F0: | F5 | F6 | F8 | F9 | FA | FA | FB | FC | FD | FD | FE | FE | FE | FF | FF | FF |
| | 100H 1FFH SIN($\theta$) | | | | | | | | | | | | | | | |
| 0: | 80 | 83 | 86 | 89 | 8C | 8F | 92 | 95 | 98 | 9B | 9E | A2 | A5 | A7 | AA | AD |
| 10: | B0 | B3 | B6 | B9 | BC | BE | C1 | C4 | C6 | C9 | CB | CE | D0 | D3 | D5 | D7 |
| 20: | DA | DC | DE | E0 | E2 | E4 | E6 | E8 | EA | EB | ED | EE | F0 | F1 | F3 | F4 |
| 30: | F5 | F6 | F8 | F9 | FA | FA | FB | FC | FD | FD | FE | FE | FE | FF | FF | FF |
| 40: | FF | FF | FF | FF | FE | FE | FE | FD | FD | FC | FB | FA | FA | F9 | F8 | F6 |
| 50: | F5 | F4 | F3 | F1 | F0 | EE | ED | EB | EA | E8 | E6 | E4 | E2 | E0 | DE | DC |
| 60: | DA | D7 | D5 | D3 | D0 | CE | CB | C9 | C6 | C4 | C1 | BE | BC | B9 | B6 | B3 |
| 70: | B0 | AD | AA | A7 | A5 | A2 | 9E | 9B | 98 | 95 | 92 | 8F | 8C | 89 | 86 | 83 |
| 80: | 80 | 7C | 79 | 76 | 73 | 70 | 6D | 6A | 67 | 64 | 61 | 5D | 5A | 58 | 55 | 52 |

TABLE 1-continued

| | | | | | | | | | | | | | | | |
|---|---|---|---|---|---|---|---|---|---|---|---|---|---|---|---|
| 90: | 4F | 4C | 49 | 46 | 43 | 41 | 3E | 3B | 39 | 36 | 34 | 31 | 2F | 2C | 2A | 28 |
| A0: | 25 | 23 | 21 | 1F | 1D | 1B | 19 | 17 | 15 | 14 | 12 | 11 | F | E | C | B |
| B0: | A | 9 | 7 | 6 | 5 | 5 | 4 | 3 | 2 | 2 | 1 | 1 | 1 | 0 | 0 | 0 |
| C0: | 0 | 0 | 0 | 0 | 1 | 1 | 1 | 2 | 2 | 3 | 4 | 5 | 5 | 6 | 7 | 9 |
| D0: | A | B | C | E | F | 11 | 12 | 14 | 15 | 17 | 19 | 1B | 1D | 1F | 21 | 23 |
| E0: | 25 | 28 | 2A | 2C | 2F | 31 | 34 | 36 | 39 | 3B | 3E | 41 | 43 | 46 | 49 | 4C |
| F0: | 4F | 52 | 55 | 58 | 5A | 5D | 61 | 64 | 67 | 6A | 6D | 70 | 73 | 76 | 79 | 7C |

200H 2FFH $-\mathrm{SIN}(\theta)$

| | | | | | | | | | | | | | | | |
|---|---|---|---|---|---|---|---|---|---|---|---|---|---|---|---|
| 0: | 80 | 7C | 79 | 76 | 73 | 70 | 6D | 6A | 67 | 64 | 61 | 5D | 5A | 58 | 55 | 52 |
| 10: | 4F | 4C | 49 | 46 | 43 | 41 | 3E | 3B | 39 | 36 | 34 | 31 | 2F | 2C | 2A | 28 |
| 20: | 25 | 23 | 21 | 1F | 1D | 1B | 19 | 17 | 15 | 14 | 12 | 11 | F | E | C | B |
| 30: | A | 9 | 7 | 6 | 5 | 5 | 4 | 3 | 2 | 2 | 1 | 1 | 1 | 0 | 0 | 0 |
| 40: | 0 | 0 | 0 | 0 | 1 | 1 | 1 | 2 | 2 | 3 | 4 | 5 | 5 | 6 | 7 | 9 |
| 50: | A | B | C | E | F | 11 | 12 | 14 | 15 | 17 | 19 | 1B | 1D | 1F | 21 | 23 |
| 60: | 25 | 28 | 2A | 2C | 2F | 31 | 34 | 36 | 39 | 3B | 3E | 41 | 43 | 46 | 49 | 4C |
| 70: | 4F | 52 | 55 | 58 | 5A | 5D | 61 | 64 | 67 | 6A | 6D | 70 | 73 | 76 | 79 | 7C |
| 80: | 80 | 83 | 86 | 89 | 8C | 8F | 92 | 95 | 98 | 9B | 9E | A2 | A5 | A7 | AA | AD |
| 90: | B0 | B3 | B6 | B9 | BC | BE | C1 | C4 | C6 | C9 | CB | CE | D0 | D3 | D5 | D7 |
| A0: | DA | DC | DE | E0 | E2 | E4 | E6 | E8 | EA | EB | ED | EE | F0 | F1 | F3 | F4 |
| B0: | F5 | F6 | F8 | F9 | FA | FA | FB | FC | FD | FD | FE | FE | FE | FF | FF | FF |
| C0: | FF | FF | FF | FF | FE | FE | FE | FD | FD | FC | FB | FA | FA | F9 | F8 | F6 |
| D0: | F5 | F4 | F3 | F1 | F0 | EE | ED | EB | EA | E8 | E6 | E4 | E2 | E0 | DE | DC |
| E0: | DA | D7 | D5 | D3 | D0 | CE | CB | C9 | C6 | C4 | C1 | BE | BC | B9 | B6 | B3 |
| F0: | B0 | AD | AA | A7 | A5 | A2 | 9E | 9B | 98 | 95 | 92 | 8F | 8C | 89 | 86 | 83 |

Table II explains the relationship between the address signals m0, m1 and the output data.

TABLE II

| m1 | m0 | Meaning | Output data |
|---|---|---|---|
| 0 | 0 | r11 | $\cos\theta$ |
| 0 | 1 | r12 | $\sin\theta$ |
| 1 | 0 | r21 | $-\sin\theta$ |
| 1 | 1 | r22 | $\cos\theta$. |

Figure 11:
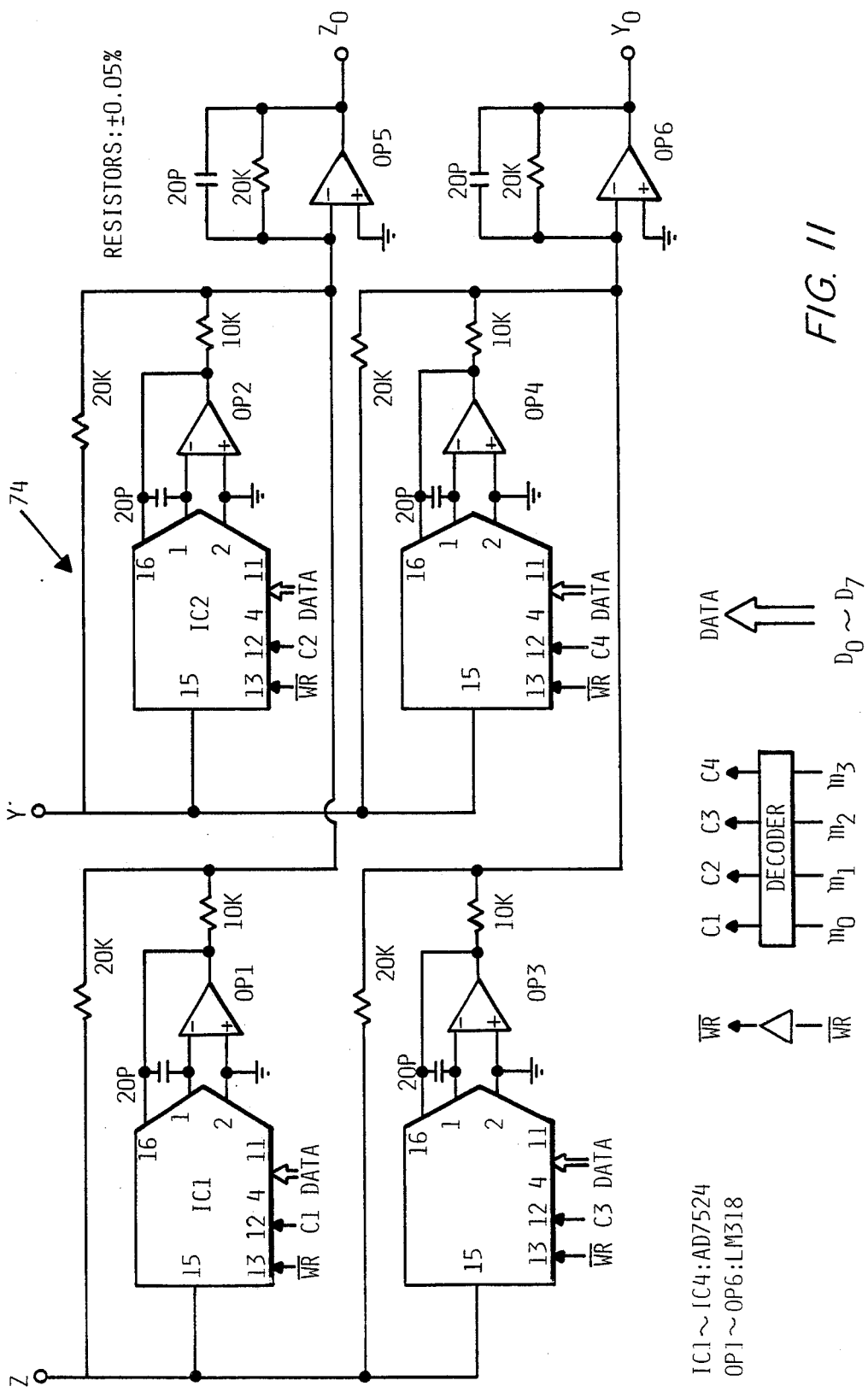
FIG. 11 is a detailed two-dimensional multiplier circuit diagram for use in the circuit of FIG. 5.

FIG. 11 is a detailed two-dimensional multiplier circuit diagram, i.e., a diagram of one of the three identical two-dimensional rotators 74, 75, 76. These have an inherent accuracy of one part in 256, better than 0.4%. The circuit is controlled by a through bus ("DATA") similar to a common microcomputer interface. This is applied to a set of four multiplying DAC, such as AD7524 made by Analog Devices. The address decoder may vary from application to application. All resistors shown in the circuit diagram should have at least 0.5% accuracy so that multiplication is sufficiently accurate and commensurate with that of the rotator.

Figure 12:
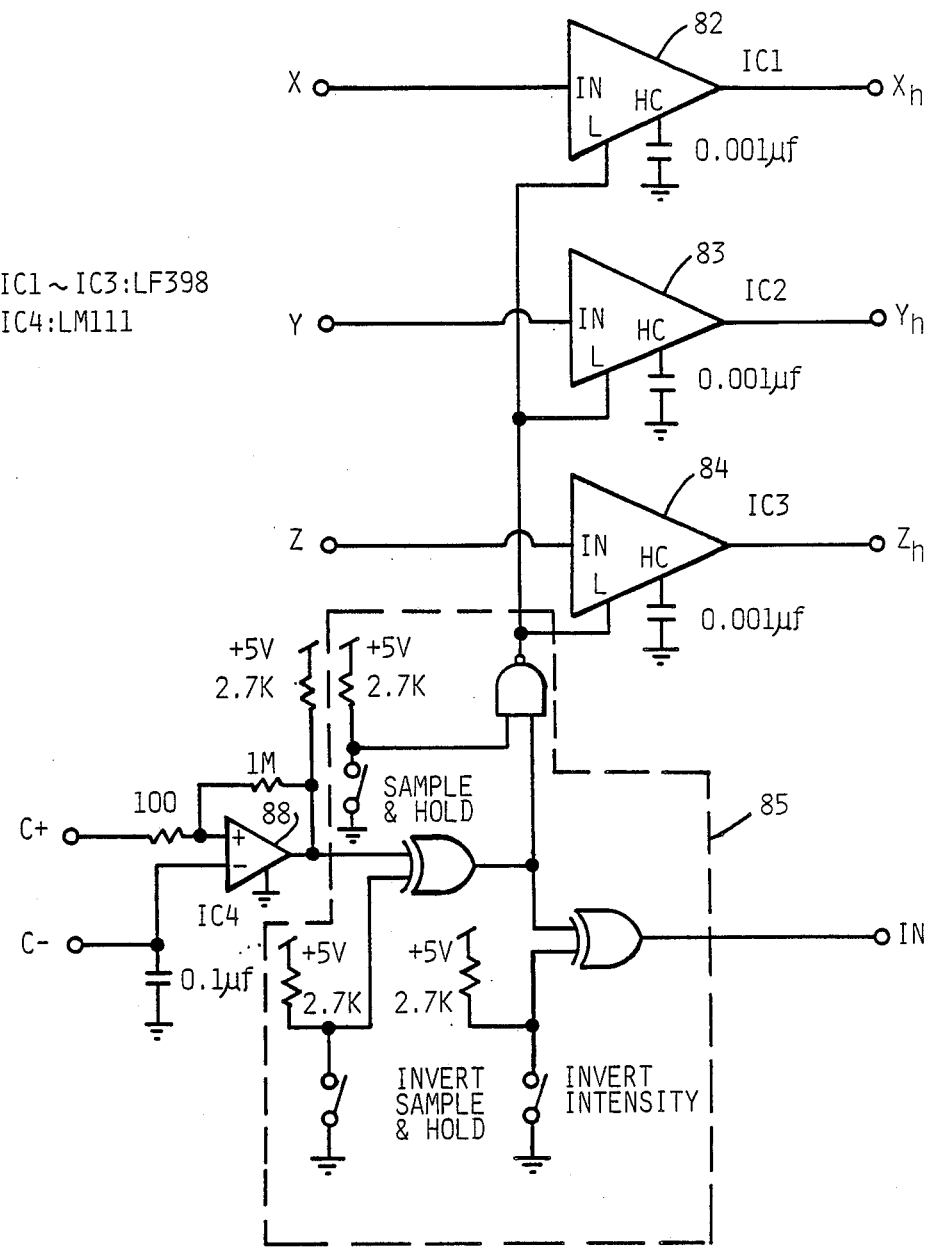
FIG. 12 is a diagram of a sample-and-hold and comparator circuit for use in the circuit of FIG. 5.

FIG. 12 is a diagram of a typical and usable sample-and-hold comparator circuit, including units 82, 83, 84, 85, and 88. Sample-and-hold units are, of course, obtained off the shelf, e.g., LF 398 for units 82, 83, 84, by National Semiconductor Corporation, as are comparators, that may be a LM111, also by National Semiconductor Corporation. Although the circuit is very simple the corresponding integrated circuit reference should be checked to avoid unexpected effects. For example, polystyrene capacitors are preferably used for the 0.001 μf connection from each of the units 82, 83, 84 to ground. Additional caution should be employed during the wiring process to minimize the stray capacitors from the units 82, 83, and 84 to the 0.001 μf capacitors.

3. A small portable apparatus

A small portable electronic instrument will now be described with reference to FIG. 15. When used with a standard oscilloscope, it enables display of a two-dimensional projection from any desired direction of a three-dimensional surface S evolving in time. The three-dimensional surface S represents the dynamic loci of three electrical signal x(t), y(t), and z(t) in the X-Y-Z space over some observation time interval, and can be interpreted as the three-dimensional generalization of the well-known Lissajous figures.

The circuit herein described is at present the least expensive approach capable of yielding good accuracy for low-frequency applications, i.e., below 10 KHz.

The instrument described here is an *analog* instrument that implements both rotation and cross-section operations in *real time*.

After a brief description of the three-dimensional rotational geometry involved, the basic design and block diagram of this simplified 3-D rotation instrument are described. To illustrate the capability of this instrument, as well as an important application in the study of chaos, some strange attractors and cross-sections are derived from a non-autonomous circuit having a series RL-diode circuit driven by a periodic signal. Similarly, the double scroll and its cross-sections, as measured from the autonomous Chua's circuit, are displayed.

A. Three-dimensional-rotation geometry

A brief description of the pertinent three-dimensional-rotation geometry may be helpful, along with the relation between the actual signal processing and the equivalent mathematical operations.

Consider first the rotation of a three-dimensional vector $S(t)=[x(t),y(t),z(t)]^T$ as a function of time. For convenience, the trajectory of S(t) is called a surface S, because the envelope of S(t) eventually forms a three-dimensional surface as time evolves. Strictly speaking, S is a *fractal*, if S(t) is associated with a strange attractor.

(1). Rotation

Rotation of a vector S(t) is simply an orthogonal transform of S(t), namely, $$S_o(t)=QS(t), \quad \text{Equation 1}$$

where Q is an orthogonal three-dimensional matrix and $S_o(t)$ is the rotated vector $y[x_o(t),y_o(t),z_o(t)]^T$.

The orthogonal matrix Q implemented in the design of this invention is defined by its decomposition or breakdown with respect to the X, Y, and Z axis; namely, $$Q=R_z(\theta_z)R_y(\theta_y)R_x(\theta_x), \quad \text{Equation 2}$$

where $$R_x(\theta) = \begin{bmatrix} 1 & 0 & 0 \\ 0 & \cos(\theta_x) & \sin(\theta_x) \\ 0 & -\sin(\theta_x) & \cos(\theta_x) \end{bmatrix},$$

$$R_y(\theta_y) = \begin{bmatrix} \cos(\theta_y) & 0 & \sin(\theta_y) \\ 0 & 1 & 0 \\ -\sin(\theta_y) & 0 & \cos(\theta_y) \end{bmatrix},$$

and $$R_z(\theta_z) = \begin{bmatrix} \cos(\theta_z) & \sin(\theta_z) & 0 \\ -\sin(\theta_z) & \cos(\theta_z) & 0 \\ 0 & 0 & 1 \end{bmatrix}.$$

Figure 13:
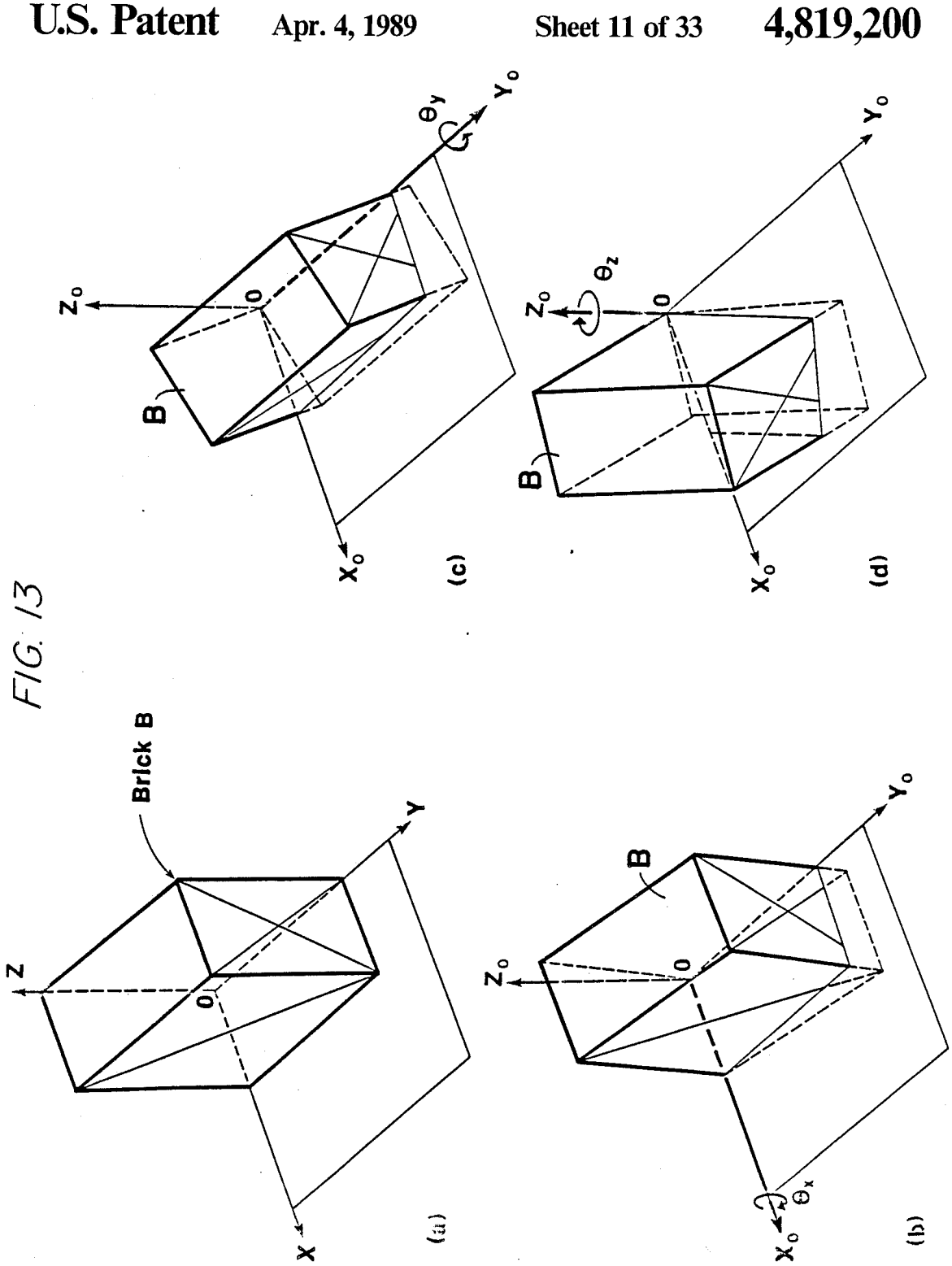

The transformation Q is equivalent to a rotation of the coordinates with respect to the origin. FIG. 13 shows the geometrical transformation of this operation. Consider the rectangular "brick" B in the input coordinate X-Y-Z space as shown in FIG. 13(a). By applying the rotation operation $R_x(\theta_x)$, the output coordinates rotate around the $X_o$-axis by $\theta_x$ in a counter-clockwise direction. This is equivalent to rotating the brick B by $\theta_x$ in a clockwise direction in the output coordinates, as shown in FIG. 13(b). Applying the operation $R_y(\theta_y)$ to the $\theta_x$-rotated brick in FIG. 13(b) is equivalent to further rotating the coordinate along the $Y_o$-axis by $\theta_y$ degree (clockwise), and hence the brick actually rotates in a counterclockwise direction as shown in FIG. 13(c). Finally, applying $R_z(\theta_z)$ to the $\theta_y$-rotated brick gives the $\theta_z$-rotated (clockwise direction) brick as shown in FIG. 13(d).

(2). Equation of plane in three-dimensional space

Consider next a plane in the three-dimensional space, which is defined as a vector field $D(x,y,z)$ such that $$D = \{D(x,y,z) | DU^T = r\}. \quad \text{Equation 3}$$

where U is a three-dimensional row vector such that $UU^T = 1$ and r is a scalar constant. Here, the vector U indicates the *normal* direction of the plane D, and r is the distance of D from the origin.

(3). Perpendicular projection

The perpendicular *projection* of a three-dimensional surface S onto a plane D can be written as $$S_p = S + (r - SU^T)U.$$
Equation 4

The geometrical interpretation of this operation is shown in FIG. 14(a). If U lies in one of the coordinates, say Z, then this transform is equivalent to replacing the corresponding compponent of S, Z(t), by a constant r.

(4). Upper and lower surface relative to plane D

We define *the upper surface* relative to a plane D defined in Equation 3 by $$S^+ = \{S | S(t)U^T - r > 0\}. \quad \text{Equation 5}$$

We define the *lower surface* relative to plane D by $$S^- = \{S | S(t)U^T - r < 0\}. \quad \text{Equation 6}$$

(5). Cross-section of surface S on D

The cross-section of a surface S on a plane D is the set of intersection points such that $$\{S | S(t)U^T - r = 0\}. \quad \text{Equation 7}$$

However, since S(t) is a function of t, we define the forward cross-section by $$\{S | S(t)U^T - r = 0 \text{ and } S(t)U^T > 0\}. \quad \text{Equation 8}$$

In other words, the forward cross-section of S(t) on a plane D is the set of intersection points such that S(t) crosses D from the lower surface to the upper surface for all t>0.

A backward cross-section is similarly defined (See FIG. 14(b)).

B. Hardware implementation

FIG. 15 shows a simplified block diagram of the instrument. An input time-varying vector, $S_i(t) = [x_i(t), y_i(t), z_i(t)]^T$, is preferably scaled by three preamplifiers 121, 122, and 123 so that all three signals have the same order of magnitudes. This is equivalent to applying a diagonal matrix operator $$G = \begin{bmatrix} g_x & 0 & 0 \\ 0 & g_y & 0 \\ 0 & 0 & g_z \end{bmatrix} \quad \text{Equation 9}$$

to $S_i(t)$.

(1). Implementing the rotation operation

Three identical two-dimensional rotators 124, 125, and 126 are used to perform the operations $R_x(\theta_x), R_y(\theta_y)$, and $R_z(\theta_z)$. Observe that the connections of the three two-dimensional rotators 124, 125, and 126 in FIG. 15 realizes the orthogonal transformation Q in Equation 2.

Hence, the output vector $S_o(t) = [x_o, y_o, z_o]^T$ of the three-dimensional rotator 127 enclosed by the dotted rectangle in FIG. 15 is the rotated vector of $S(t) = [x(t), y(t), z(t)]^T$. To view its projection, we simply pick two of the three signals from the sample and hold circuits 128, 129, and 130. This operation is equivalent to choosing U to be the unit vector $[1,0,0]^t$, $[0,1,0]^T$, or $[0,0,1]^T$ and then applying the perpendicular projection (2.4) to $S_o(t)$. Since $S_o(t)$ can be rotated by any desired angle, the projection of S(t) from any direction can be displayed on the oscilloscope screen.

(2) Implementing the cross-section operation

The three sample-and-hold (S&H) circuits 128, 129, and 130 and a comparator 131 on the right side of FIG. 15 are all that is needed for displaying any desired cross-section on D. Again, without loss of generality, the plane D is specified by choosing U in Equation 3 to be the unit vector $[1,0,0]^T$, $[0,1,0]^t$, or $[0,0,1]^T$. Here, the plane D can be defined, with the help of a switch $S_D$, in terms of either the input coordinates (X,Y,Z,) or the output (rotated) coordinates ($X_o$, $Y_o$, $Z_o$). (The switch $S_D$ in FIG. 15 is drawn for the case $U = [0,0,1]^T$ for convenience. For increased flexibility and operational convenience, a six-position switch, (three for input coordinates, and three for output coordinates) is recommended.) Since U has only one nonzero element, the times when S(t) intersects D can be easily and accurately detected by comparing one of the signals, say Z(t), and a constant r. Since the signals are time-varying, their values at the intersection point should be held for a short period of time. Three sampled-and-hold circuits are used for this purpose.

Most of the functional blocks in FIG. 15 are implemented by using off-the-shelf integrated circuit modules. The detailed circuit for the design depends on the choice of integrated circuit modules.

(3) Detailed rotation circuits

The heart of any rotation circuit for implementing the transformation of Equation 2 is a *multiplier*. Although the signals to be rotated are generally changing rapidly in time, the rotation angle is either a constant, or is changing continuously but slowly, if the surfaces is to be rotated continuously through all angles. Hence, it is possible to build a multiplier by operational amplifiers and potentiometers where the position of the potentiometers represent each element value of matrix M. If the potentiomers are adjusted so that the matrix M becomes orthogonal, then M implements a rotation. This simple design, however, is inaccurate and cumbersome in practice because the adjustments are tedious and error prone.

In a preferred design of this invention a multiplying digital-to-analog converter (MDAC) is employed as the basic multiplier. The MDAC is a resistor array with electronically controllable switches (for example, MOS transistors). Hence, it can be used either as a multiplier, or as a variable-gain amplifier when incorporated with a summing operational amplifier. Eight- to twelve-bit MDACs are now widely available.

FIG. 16 shows a detailed circuit diagram of this scalar multiplier 132 using an MDAC. Here, an eight-bit R-2R ladder network generates a set of binary-weighted currents. Digitally controlled switches, S-1 to S-8, are used to switch these currents between ground and the operational amplifier input which is at virtual ground. Since these currents are proportional to the input voltage $V_i$, the output voltage is given by $$V_o = -(D_7/2^1 + D_6/2^2 + \ldots + D_0/2^8)V \qquad \text{Equation 10}$$

where $D_x = 1$ or 0.

Hence, the *gain* between the input and the output varies from 0/256 to 255/256. This means that the multiplier constant can be adjusted to any value between 0.0 to 1.0, and is accurate to within the discretization error.

FIG. 17 is a circuit diagram for a two dimensional matrix multiplier consisting of four scalar multipliers M1, M2, M3, and M4, each like the multiplier 120. Two operational amplifiers 133 and 134 are connected as adders to implement the summing operation required in the matrix multiplication. The relation between the inputs and the outputs of this circuit is $$\begin{bmatrix} x_o \\ y_o \end{bmatrix} = \begin{bmatrix} r_{11} r_{12} \\ r_{21} r_{22} \end{bmatrix} \begin{bmatrix} x_i \\ y_i \end{bmatrix} \qquad \text{Equation 11}$$

where $r_{ij}$ can assume one of 512 discrete values between $-1.0$ to 1.0.

Conversion from a rotation angle $\theta$ to the multiplication constants $r_{ij}$ can be implemented by either using a microcomputer or other digital circuit techniques. In our design, a Read-Only Memory (ROM) is used to map $\theta$ into $r_{ij}$. This approach is both simple and efficient because it is equivalent to looking up a trigonometric function table electronically.

The mode of the sample-and-hold circuits 127, 128 and 129 is controlled by a comparator 131, which detects the time $t_k$ such that one of signals, say $Z_o(t_k)$, is equal to the reference voltage r. By holding the value of the signals t and the time $t_k$, the intersection point on the oscilloscope screen can be observed. If the signals are sufficiently fast, the intersections, although occurring at different times, will appear to the eye as a set of points on the cross-section of S on the reference plane D.

The comparator output can also be used to control the beam intensity of the oscilloscope so that some part of the trajectory is blanked out from the screen. FIG. 18 is an example of such a selective display. Here, X(t), Y(t), and Z(t) are sample waveforms. If the comparator is used to compare Z(t) and the constant r, its output C(t) will be as shown in FIG. 18. By applying C(t) or inverted C(t) to the intensity input of an oscilloscope, only the *upper* or the *lower* surface of S relative to D in Equation 3 will be displayed.

FIG. 19 shows an example of a cross-section display. If the sample-and-hold circuits are controlled by C(t), their output waveforms, $X_k(t)$, $Y_k(t)$, and $Z_k(t)$ corresponding to the reference value r In FIG. 18 will appear as shown by the *solid* curves on FIG. 19. The dotted curves denote the original waveform. In this case, the values of $X_o(t)$, $Y_o(t)$, and $Z_o(t)$ are held whenever $Z_o(t)$ crosses the constant value r from the upper side. Hence, when the signals during the holding periods are displayed on the screen, a *backward cross-section* on D is obtained. In FIG. 19(b), the signals are held whenever $Z_o(t)$ crosses the constant value r from the lower side. The corresponding signals will display the *forward cross-section* with respect to D.

The other circuit functions that are not shown in the block diagram in FIG. 15 include a controlling circuit for rotation angles, a reference plane generator, and a signal-reference plane multiplexer block, all shown in FIG. 5. These blocks are included for the user's convenience.

3. Displaying strange attractors of a nonautonomous circuit

Strange attractors of a second-order nonautonomous circuit can be displayed using our 3-D rotation instrument. They represent snap shots when the strange attractor S—which is being viewed when S is rotated continuously and periodically through all angles—is frozen momentarily at different selected angles of rotation.

A. Series R-L-diode circuit

Consider the series RI diode circuit shown in FIG. 20(a). This circuit is similar to one used by several other researchers except that the inductor value and the type of diode are here chosen so that the strange attractor is scaled down in frequency to about 10 KHz. A 20 Ω resistor is included for sensing the current $I_D$ through the device.

As the excitation frequency was increased, a doubling of the fundamental period, i.e., reciprocal of frequency, was observed followed by period quadrupling etc., and finally by a first *chaotic* band (see FIG. 26(a)). Further increase in the excitation frequency gave rise to a *period 3 periodic window*. This was followed by another period-doubling process which led to a second chaotic band, etc., as shown in FIG. 26(a).

A conventional method to characterize the periodic orbit or strange attractor in such a system is to sample the waveforms at the input frequency for different phase angles of the input signal. Such a cross-section is called a *Poincaré map*. The instrument can be used not only to display these conventional Poincar/é maps, but also to look at Poincaré maps at different perspectives. To do this, the excitation signal is chosen as the third variable, although it is not a state variable. Since the excitation signal is a periodic function of time, this third axis can be interpreted as a periodically-folded map of time. FIG. 20 (b) shows a coordinate system for the nonautonomous case. This simple set-up provides an extremely flexible and powerful tool for analyzing the fine geometrical structure of strange attractors that was not possible before.

Since there is now a three-dimensional space $V_D$, $I_D$, and $V_S$, instead of just a two-dimensional system, $V_D$ and $I_D$, as in the conventional case, a cutting plane can be defined in any desired position in the three-dimensional space. One advantage of this approach is that by observing the three-dimensional surface S from only a few appropriate directions, the local structure of S can usually be determined without taking discrete Poincaré maps at many phases of the input signal. In the special case when the cutting plane is chosen to be orthogonal to the excitation axis, then the cross-section becomes the conventional Poincaré maps. In other words, the instrument is much more versatile than just taking Poincaré maps.

B. Some features employed in displaying strange attractors

The following features of the instrument are used in displaying the strange attractors:

(1) Prescaling: Before applying any rotation, the input signals $S_i(t)=[x_i(t),y_i(t),z_i(t)]^T$ should be scaled so that the input signals of the rotator $S(t)=[x(t),y(t),z(t)]^T$ have almost the same magnitudes.

(2) Projection: The instrument lets one choose any one of the $X_o$-$Y_o$, $Y_o$-$Z_o$, or $Z_o$-$X_o$ planes as the projection plane. Hence, for each rotation operation prescribed by $(\theta_x, \theta_y, \theta_z)$, three orthogonal projections can be taken easily.

(3) Cross-section: The instrument enables choice of either the output (i.e., rotated) $X_o$-$Y_o$ plane, or the input (i.e., unrotated) X-Y plane as the cutting plane D. Moreover, either a forward or a backward cross-section relative to D can be displayed with equal ease.

(4) Reference plane: As a frame of reference and reminder of the relative position of the projection plane and the input (unrotated) X-Y plane,—henceforth called the *reference plane*—, which need not coincide with the cutting plane D, this reference plane can be displayed simultaneously with the projected surface S or the cross-section. The first quadrant of this reference plane will always appear (when requested) as a *uniform grid of points* on the oscilloscope screen.

4. Projecting periodic attractors

The periodic waveform $I_D(t)$, $V_D(t)$, and $V_S(t)$ (at a fixed input frequency) are displayed in FIG. 21(a), along with the signal C(t) from the comparator. Note that the period of $V_D(t)$ is three times that of $V_s(t)$. The projection of the surface S generated by $I_D$, $V_D$, and $V_S$ onto the $V_D$-$I_D$ plane is shown in FIG. 21(b). Note the "barely visible" 3-loop Lissajous figure indicates a period-3 relation between $V_D$ and $I_D$. Here, the output signal is at the input of the sample-and-hold circuits and hence C(t) is irrelevant.

In FIG. 22, the rotation operation ($\theta_x = -50.6°$, $\theta_y = -18.3°$, and $\theta_z = 166.0°$) is applied, and then projections are taken. FIG. 22(a) shows the position of the rotated $V_D$-$I_D$ plane. The cutting plane D in this case is a plane parallel to the reference plane but passing through the $V_S$-axis at $V_S$=r. By comparing the waveform of $V_S(t)$ and the threshold r, either the projection of either the upper surface or the lower surface, respectively, can be displayed.

FIG. 22(b) shows the projection of the rotated surface S onto the $X_o$-$Y_o$ plane (the oscilloscope screen), along with the position of the rotated reference plane. Note that the period-3 nature of $V_D(t)$ is much clearer than that of FIG. 21(b). This demonstrates the power of rotation provided by this instrument: with an appropriate choice of rotation angles ($\theta_x$, $\theta_y$, $\theta_z$), the projection reveals many more details of the attractor that were otherwise hidden (as in FIG. 21(b) prior to rotation.

In addition to the projection shown in FIG. 22(b), where the comparator signal C(t) is irrelevant, FIG. 22(c) and 22(d) show the projection of the *upper* and *lower surface* achieved by blanking out the other portion with the held of the blanking signal C(t). Note that if FIG. 22(d) is superimposed on FIG. 22(c), a complete projection per FIG. 22(b), would be recovered, as expected.

A second application of the comparator signal C(t), is to display the *backward* and *forward* cross-sections of the above period-3 attractor relative to the cutting plane D through $V_S$=r, as depicted in FIG. 23(a). The signal $I_D(t)$, $V_D(t)$, and $V_S(t)$ at the output of the sample-and-hold circuits are shown in FIG. 23(b) along with C(t). As expected, the backward and forward cross-section shown in FIG. 23(c) and 23(d) comprises three *isolated* points indicating $V_D(t)$ is period-3 relative to $V_S(t)$.

5. Projecting chaotic attractors

FIGS. 24(a), 24(b), and 24(c) show the projection of the rotated chaotic attractor (in the first chaotic band in FIG. 26(a)) on the three orthogonal planes ($X_o$-$Y_o$, $Y_o$-$Z_o$, or $Z_o$-$X_o$ planes), where the input signal Vs is a triangular waveform. Some part of this strange attractor is not clearly displayed because its probability of being visited by the chaotic signal is small relative to the other part of the attractor. However, by taking appropriate cross-sectional views, this "exposure" problem will be overcome. The relative position of the rotated $V_D$-$I_D$ plane corresponding to FIGS. 24(a), (b), and (c) are depicted in FIG. 24(d).

FIG. 25 shows the projection of several backward cross-sections of the above strange attractor relative to the cutting plane D passing through several different values of $V_S$=r, as depicted in FIG. 25(a). Note that while the dotted reference plane in FIGS. 25(b)-(f) has been rotated, the cutting plane D is always perpendicular to the vertical axis $V_S$.

Observe that the cross-section in FIG. 25(f) reveals the presence of two "legs" (magnified in FIG. 26(b)) which was not observable from the cross-sections (b), (c), and (d). This two-leg attractor corresponds to that observed from the first chaotic band.

Another cross-section measured with the input frequency chosen to lie within the second chaotic band in FIG. 26(a) is shown in FIG. 26(c). This three-leg attractor corresponds to a similar attractor elsewhere reported.

The above example clearly demonstrates the importance of choosing different cross-sections, which in the instrument of this invention corresponds to tuning a single knob to set the dc reference signal r.

6. Displaying strange attractors of an autonomous circuit

The chaotic behavior of Chua's circuit (FIG. 27) has been reported. From hundreds of hours of computer simulation, the chaotic attractor was found to have cross-sections consisting of two tightly wound spirals. The unique geometric structure inspired the name *dou-

*ble scroll.* Prior to this invention, however, no one, had seen the double scroll cross-section experimentally. An application of the invention confirms the double scroll structure, using the 3-D rotation instrument.

The waveforms of the three state variables, $-I_L$, $V_{C1}$ and $V_{C2}$ are shown in FIG. 28 where the horizontal scale is 1 msec per division. Note that all variables oscillate at an approximate rate of 10 Khz and that the waveforms appear to be chaotic.

A. Projection views of the double scroll attractor

FIGS. 29(a), (b) and (c) show the "unrotated" projection of the double scroll onto the $(-I_L)$-$V_{C1}$, $(-I_L)$-$V_{C2}$, and the $V_{c1}$-$V_{c2}$ planes, respectively. FIGS. 30(a), (b), and (c) show the projections of the rotated upper surface relative to a $Z=0$ plane (the reference plane in this case coincides with the $Z=0$ plane) onto the $X_o$-$Y_o$, $Y_o$-$Z_o$, or $Z_o$-$X_o$ planes, respectively. The relative position of the reference plane is depicted in FIG. 30(d). The "upper surface" of the scroll shown in FIG. 30 corresponds to the portion of the double scroll above $V_{c2}=0$. Note that the "dotted" reference plane is absent from FIG. 30(c) because it is perpendicular to the paper and hence its projection consists of only points along with the 135°-straight line through the origin.

B. Cross-sectional views of the double scroll attractor

A cutting plane D parallel to the $(-I_L)$-$V_{c2}$ plane and located at $C_{C1}=r$ is shown in FIG. 31(a). Several cross-sections of the double scroll on D for different values of r are shown in FIG. 32.

FIG. 31(b) shows the projection of the double scroll and its four forward cross-sections onto the $(-I_L)$-$V_{c1}$ plane. The four forward cross-sections S1, S2, S3, and S4 appear as horizontal lines in FIG. 31(b) because the projection plane $((-I_L)$-$V_{c1}$ plane) is orthogonal to the $V_{C1}=r$ planes.

FIGS. 32(a), (b), (c) and (d) give the projection of the forward cross-sections S1, S2, S3, and S4 onto the $(-I_L)$-$V_{c2}$, plane. A print image of the projection of the double scroll onto the $(-I_L)$-$V_{c2}$ plane is also displayed to show the relative location of these cross-sections and that of the double scroll. Note that the near-circular contour corresponds to the projection of the lower "hole" of the double scroll attractor.

Backward cross-sections of the double scroll can also be easily obtained. Both forward and backward cross-sections of the double scroll on three different cutting planes (corresponding to S1, S2, and S3) are shown in FIG. 33. These pictures agree completely with the recent rigorous analysis of the geometric structure of the double scroll, where the lower line corresponds to the "entrance gate" and the double spiral corresponds to the "exit gate".

The preceding projections and cross-sections were measured directly (i.e., without rotation) from the double scroll. FIG. 34 shows the result obtained by rotating the double scroll as depicted in FIG. 34(a) by an angle $\theta_z=56.25°$ about the $V_{C1}$-axis as depicted in FIG. 34(a). The projection of this rotated double scroll onto the $X_o$-$V_{C1}$ plane is shown in FIG. 34(b) along with the two forward cross-sections S1 and S2 on the cutting plane parallel to the $X_o$-$Y_o$ plane and passing through $V_{C1}=r$ (See FIG. 34(a)). This projection reveals that the upper and lower Saturn-like subset of the double scroll are *extremely thin* and that they are parallel to each other and perpendicular to the $X_o$-$V_{C1}$ plane. This conclusion had of course previously been reported and proved, but not before spending literally hundreds of hours on the computer. Using the present instrument, this important geometrical structure is revealed instantly.

The projection of the two forward cross-sections S1 and S2 of the rotated double scroll on the cutting planes depicted in FIG. 34(a) are shown in FIGS. 35(a) and (b), respectively. Note that they are merely rotations by the same angle $\theta_z$ of the corresponding cross-sections in FIGS. 32(a) and (b), respectively, as expected.

FIG. 36 shows the superposition of a projection and a cross-section of the double scroll after it has been rotated by some angle $\theta_x$, $\theta_y$, and $\theta_z$. The cutting plane in this figure coincides with the projection plane ($X_o$-$Y_o$ plane). By applying the blanking signal C(t) corresponding to $r=0$, the projection onto the $X_o$-$Y_o$ plane of the *upper* double scroll is obtained in FIG. 36(a), and of the *lower* double scroll in FIG. 36(c), respectively. As expected, if the two halves in FIGS. 36(b) and (c) are joined together, the complete cross-section in FIG. 36(a) is obtained. These *half* cross-sections are very useful, in that they reveal the directions of the trajectories (out of the paper in FIG. 36(b) and into the paper in FIG. 36(c)) in different portions of the cross-section. Such information is invaluable in deriving the fine "local" structure of strange attractors.

SUMMARY

The invention thus provides a real-time preprocessor for the oscilloscope for rotating three-dimensional Lissajous figures through any angle, either fixed at some discrete value, or varying continuously in a periodic manner. Applications of this three-dimensional rotation instrument for observing strange attractors are illustrated for both autonomous and non-autonomous circuits. Many of the projections and cross-sections of strange attractors have never been seen before and reveal many new insights into the local structure of strange attractors. Many of these cross-sections confirmed observations which were obtained previously through hundreds of hours of brute-force computer simulation.

Since the rotation operation is valid not only in three-dimensions, but in any number of dimensions, the basic design can be easily extended to any higher dimension. In particular, this extension is applicable to the measurement of higher-dimensional dynamic systems and for monitoring multiple-channel signals. Since the complexity of the geometric structure in strange attractors grows very quickly as the dimension increases, brute-force computer simulation is no longer practical. In such cases, higher-dimensional versions of this instrument is expected to play an increasingly important if not indispensable role.

The simplified instrument described above can be built using only low-frequency inexpensive integrated circuit modules. More careful circuit design and choice of components can result in a significantly increased operating frequency range and accuracy. Also, the controlling circuit may be replaced by a micro-computer or interfaced with the host controller for increased flexibility.

In addition, more flexible reference signals can be generated by using ROM and D/A converters. Extensive applications of the instruments, already made have shown that the reference signals are not just for convenience, but often they play crucial roles in identifying what one is looking at and their approximate scale. Hence, even though it is not essential, a reference-signal generator implementation in this instrument is highly recommended.

Also, several comparators may be helpful in dividing the surface S into several regions simultaneously. This feature increases the flexibility of our measurement process.

Finally, the invaluable applications of this three-dimensional rotation instrument as a tool for analyzing the geometric structures of three-dimensional Lissajous figure in general, and of strange attractors in particular, cannot be overemphasized.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. A device for use with a cathode ray oscilloscope for displaying from any desired perspective a multidimensional surface evolving in time, including in combination:
   multi electrical signal introduction means for attachment to related electrical signal-carrying means,
   multiplicity of two-dimensional rotator means, so that for the number N of signals and also of N dimensions there are $$N!/2(N-2)!$$

two dimensional rotator means, each rotator means connected to a different pair of said signal introduction means, for enabling two-dimensional rotation of the paired signals, said rotator means being connected together to produce signal outputs corresponding to the number of said signal introduction means, each signal passing through two of said signal rotator means as each signal makes its way to its respective signal output, and
   connection means for connecting said signal outputs to a cathode ray oscilloscope, at least two at a time.

2. The device of claim 1 having
   continuous means for applying signals to said rotator means for obtaining continuous rotation of the signals from said signal outputs.

3. The device of claim 1 having
   generator means for generating reference plane signals for application to said oscilloscope and
   multiplex means connected to said signal outputs for rapidly alternating said reference plane signals with said signals output from said signal outputs.

4. The device of claim 1 having pre-amplifier means between each said signal introduction means and its said rotator means.

5. An analog matrix multiplier, comprising
   input means for inputting at least two analog input electrical signals $X(t)=[X_1(t), X_2(t) \ldots X_N(t)]^T$ and
   at least two analog output signal means for outputting electrical signals $Y(t)=[Y_1(t), Y_2(t) \ldots Y_N(t)]^T$,
   electrical matrix multiplier means connected to electrical input means for performing matrix multiplication $Y=QX$ of said input signals being provided to said matrix multiplier means, said matrix multiplier means having a matrix multiplier operator $q_{i,j}$,
   electrical matrix multiplication constant controlling means for controlling each element value of matrix multiplication operator, $q_{i,j}$ means,
   whereby the matrix Q is an orthogonal matrix such that $QQ^T=I$, where I is the identity matrix,
   said output signals being taken from the matrix multiplier means, where each multiplier constant of said matrix multiplier means is controlled by a matrix multiplication means so that matrix operator is always orthogonal,
   said matrix multiplier means being connected to said two analog output signal means and sending said output signals there, and
   electrical display means connected to said two analog output means, for displaying the output from said analog output means.

6. The analog matrix multiplier of claim 5, wherein said matrix multiplier means comprises several two-dimensional sub-matrix multiplier means, each having exactly two inputs and two outputs, their input-output relation being given by $$Y1 = r_{11}X1 + r_{12}X2,$$

$$Y2 = r_{21}X1 + r_{22}X2,$$

where $r_{11}=\cos(\theta_k)$, $r_{12}=\sin(\theta^k)$, $r_{21}=-\sin(\theta_k)$, and $r_{27}-\cos(\theta_k)$, and $\theta_k=$ a parameter called the rotating angle.

7. The analog matrix multiplier of claim 5, wherein the multiplication constant controlling means comprises an electrical micro-controller which executes a sequence of instructions stored in memory and generates all multiplication constants of the said matrix multiplier means such that the matrix Q becomes orthogonal with the given rotation angles which are entered by a data entry means.

8. The analog matrix multiplier of claim 7 wherein the microcontroller performs the following transformations digitally:
   (0) reading the rotation angles $\theta k$ from data entry means,
   (1) set time $Q=I$ and $k=1$,
   (2) picking a combination [i,j] from numbers 1,2, ... ,N, if all of the combinations are already picked going to (11),
   (3) set time the matrix $R=I$,
   (4) set time $r_{is}=\cos(\theta_k)$,
   (5) set time $r_{jj}=\cos(\theta_k)$,
   (6) set time $r_{ij}=\sin(\theta_k)$,
   (7) set time $r_{ji}=\sin(\theta_k)$,
   (8) multiplying R and Q and storing the result into Q,
   (9) raising k to $K+1$;
   (10) going to step (2) again,
   (11) outputting all multiplication constants of Q, $q_{i,j}$ to said matrix multiplier means.

9. A device for use with a cathode ray oscilloscope for displaying from any desired perspective a three dimensional surface evolving in time, including in combination:
   at least three electrical signal introduction means for attachment to at least three related electrical signal-carrying means,
   three two-dimensional rotator means, each connected to a different pair of said signal introduction means, for enabling two-dimensional rotation of the paired signals, said rotator means being connected together to produce three signal outputs, each corresponding to one said signal introduction means, each signal passing through two of said three signal rotator means on its way to its said signal output, and connection means for connecting any two said signals from said signal outputs to a cathode ray oscilloscope.

10. The device of claim 9 having
continuous means for applying signals to said rotator means for obtaining continuous rotation of the signals from said signal outputs.

11. The device of claim 9 having
generator means for generating reference plane signals for application to said oscilloscope and
multiplex means connected to said signal outputs for rapidly alternating said reference plane signals with said output from said signal outputs signals.

12. The device of claim 9 having pre-amplifier means between each said signal introduction means and said rotator.

13. An analog matrix multiplier, comprising
electrical input means for inputting three analog input signals $X(t) = [X_1(t), X_2(t), X_3(t)]$ and
three electrical analog output signal means for outputting $Y(t) = [Y_1(t), Y_2(t), Y_3(t)]$,
electrical matrix multiplier means for performing matrix multiplication $Y = QX$, said input signals being provided to said matrix multiplier means, said matrix multiplier means having a matrix multiplier operator $q_{ij}$,
electrical matrix multiplication constant controlling means for controlling each element value of matrix multiplication operator $q_{i,j}$,
whereby the matrix Q is an orthogonal matrix such that $QQ^T = I$, there I is the identity matrix,
said output signals being taken from the matrix multiplier means, where each multiplier constant of said matrix multiplier means is controlled by a matrix multiplication means so that matrix operator is always orthogonal,
said matrix multiplier means being connected to said two analog output signal means and sending said output signals there, and
electrical display means connected to said two analog output means, for displaying the output from said analog output means.

14. The analog matrix multiplier of claim 13, wherein said matrix multiplier means comprises several two-dimensional sub-matrix multiplier means, each having exactly two inputs and two outputs, their input-output relation being given by $Y1 = r_{11}X1 + r_{12}X2,$ $Y2 = r_{21}X1 + r_{22}X2,$ where $r_{11} = \cos(\theta_k)$, $r_{12} = \sin(\theta^k)$, $r_{21} = -\sin(\theta_k)$, and $r_{27} - \cos(\theta_k)$, and $\theta_k$ = a parameter called the rotating angle.

15. A method employing a cathode ray oscilloscope for displaying from any desired perspective a multi dimensional surface evolving in time, including in combination:
introducing a multiplicity of pairs of electrical signals to a rotation zone,
in said rotation zone, rotating said pairs of signals in two-dimensions, each rotation being done to a different pair of said signals, each individual signal being subjected to rotation in pairing with each other said signal,
connecting at least two said pairs to a cathode ray oscilloscope, and
displaying them there.

16. The method of claim 15 including
continuous means for applying signals to said rotator means for obtaining continuous rotation of the output signal.

17. The method of claim 15, including
generating reference plane signals for application to the oscilloscope and
multiplexing and rapidly alternating said reference plane signals with the rotating output signals.

18. The method of claim 15, including pre-amplifying each signal before rotating them.

19. A method of analog multiplication of matrices comprising
electrically inputting at least two analog input signals $X(t) = [X_1(t), X_2(t) \ldots X_N(t)]^T$ and
electrically outputting corresponding analog output signal means for outputting $Y(t) = [Y_1(t), Y_2(t) \ldots Y_N(t)]^T$,
electrically performing matrix multiplication $Y = QX$ on said input signals,
electrically controlling each element value of the matrix multiplication during said performing step,
electrically thereby keeping the matrix Q as an orthogonal matrix such that $QQ^T = I$, where I is the identity matrix,
electrically taking said output signals from the matrix multiplication step, and
applying said output signals to a cathode ray oscilloscope and displaying the result there.

20. The method of claim 19 wherein said matrix multiplication is done by several two-dimensional sub-matrix multiplier means, each having exactly two inputs and two outputs, their input-output relation being given by $Y1 = r_{11}X1 + r_{12}X2,$ $Y2 = r_{21}X1 + r_{22}X2,$ where $r_{11} = \cos(\theta_k)$, $r_{12} = \sin(\theta^k)$, $r_{21} = -\sin(\theta_k)$, and $r_{27} - \cos(\theta_k)$, and $\theta_k$ = a parameter called the rotating angle.

* * * * *

UNITED STATES PATENT AND TRADEMARK OFFICE
CERTIFICATE OF CORRECTION

PATENT NO. : 4,819,200

DATED : April 4, 1989

INVENTOR(S) : Leon O. Chua, Tsutomu Sugawara

It is certified that error appears in the above-identified patent and that said Letters Patent is hereby corrected as shown below:

On the title page, item [75]:

Please correct the spelling of the name of the co-inventor "Isutomu Sugawara" to correctly read --Tsutomu Sugawara--.

Signed and Sealed this

Twenty-sixth Day of June, 1990

Attest:

HARRY F. MANBECK, JR.

*Attesting Officer*　　　　*Commissioner of Patents and Trademarks*